United States Patent
Hayashi et al.

(10) Patent No.: US 9,946,513 B2
(45) Date of Patent: Apr. 17, 2018

(54) SEMICONDUCTOR DEVICE AND INFORMATION PROCESSING SYSTEM

(71) Applicant: HITACHI, LTD., Chiyoda-ku, Tokyo (JP)

(72) Inventors: Masato Hayashi, Tokyo (JP); Masanao Yamaoka, Tokyo (JP); Chihiro Yoshimura, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

(21) Appl. No.: 15/324,178

(22) PCT Filed: Jul. 9, 2014

(86) PCT No.: PCT/JP2014/068344
§ 371 (c)(1),
(2) Date: Jan. 5, 2017

(87) PCT Pub. No.: WO2016/006071
PCT Pub. Date: Jan. 14, 2016

(65) Prior Publication Data
US 2017/0185380 A1 Jun. 29, 2017

(51) Int. Cl.
*G06F 17/18* (2006.01)
*G06F 7/58* (2006.01)
(Continued)

(52) U.S. Cl.
CPC ............. *G06F 7/588* (2013.01); *G06F 17/18* (2013.01); *G06N 7/005* (2013.01); *G11C 11/16* (2013.01);
(Continued)

(58) Field of Classification Search
CPC ........ G06N 99/002; G06N 7/00–7/005; B82Y 10/00; G11C 11/16
(Continued)

(56) References Cited

U.S. PATENT DOCUMENTS 9,411,026 B2 8/2016 Yamamoto et al.
9,606,965 B2* 3/2017 Yoshimura .............. G06F 17/18
(Continued)

FOREIGN PATENT DOCUMENTS

WO WO 2012/118064 A 9/2012

OTHER PUBLICATIONS

N. Ito and Y. Kanada, "Monte Carlo simulation of the Ising model and random number generation on the vector processor," Proceedings Supercomputing '90, pp. 753-763, 1990.*
(Continued)

*Primary Examiner* — Matthew Sandifer
(74) *Attorney, Agent, or Firm* — Miles & Stockbridge P.C.

(57) ABSTRACT

A spin unit provided with a memory cell that stores a value of one spin of an Ising model, a memory cell that stores an interaction coefficient from an adjacent spin which interacts with the corresponding spin, a memory cell that stores an external magnetic field coefficient of the one spin and circuits that determine the next state of the one spin on the basis of a product of a value of each adjacent spin and the corresponding interaction coefficient and the external magnetic field coefficient is configured, the semiconductor device is provided with a spin array where the plural spin units are arranged and connected on a two-dimensional plane on a semiconductor substrate, a random number generator and a bit regulator, the bit regulator operates output of the random number generator and supplies a random bit to all spin units in the spin array via one wire.

9 Claims, 17 Drawing Sheets

(51) Int. Cl.
*G11C 11/16* (2006.01)
*G06N 99/00* (2010.01)
*G06N 7/00* (2006.01)
*H03L 7/26* (2006.01)
*H01L 27/11* (2006.01)

(52) U.S. Cl.
CPC ............ *H01L 27/11* (2013.01); *H03L 7/26* (2013.01); *G06N 99/002* (2013.01)

(58) Field of Classification Search
USPC .............................................. 703/2; 977/933
See application file for complete search history.

(56) References Cited

U.S. PATENT DOCUMENTS

2016/0062704 A1* 3/2016 Yamaoka ............... G06N 7/005
711/104
2016/0063725 A1* 3/2016 Yoshimura ............. G06N 7/005
382/173
2016/0064099 A1* 3/2016 Yamaoka ............... G11C 29/08
365/200
2016/0065210 A1* 3/2016 Yoshimura ......... H03K 19/0002
326/56
2016/0118106 A1* 4/2016 Yoshimura ............ G11C 11/419
365/156

OTHER PUBLICATIONS

Y. Lin, F. Wang, X. Zheng, H. Gao, L. Zhang, "Monte carlo simulation of the Ising model on FPGA", J. Comput. Phys., vol. 237, pp. 224-234, 2013.*

Wrighton, Michael G. et al; "Hardware-Assisted Simulated Annealing with Application for Fast FPGA Placement", FPGA '03 Proceedings of the 2003 ACM/SIGDA eleventh international symposium on Field programmable gate arrays, pp. 33-42.

* cited by examiner

FIG. 12

| OPERATION TYPE | NUMBER OF BITS | BIT PROBABILITY | NUMBER OF TIMES OF INTERACTION |
|---|---|---|---|
| OR | 3 | 0.875 | 100 |
| OR | 2 | 0.75 | 110 |
| OR | 1 | 0.5 | 121 |
| AND | 2 | 0.25 | 133 |
| AND | 3 | 0.125 | 146 |
| AND | 4 | 0.0625 | 161 |
| AND | 5 | ABOUT 0.0313 | 177 |
| (OMITTED) | | | |
| AND | 20 | ABOUT $9.5 \times 10^{-7}$ | 672 |

SEMICONDUCTOR DEVICE AND INFORMATION PROCESSING SYSTEM

TECHNICAL FIELD

The present invention relates to a semiconductor device that searches for a ground state of an Ising model, and especially relates to a semiconductor device that simulates spin of the Ising model as a flip-flop of a CMOS device.

BACKGROUND ART

The Ising model is a statistical-mechanical model for explaining behavior of a magnetic substance. The Ising model is defined by spin that takes a binary of +1 and −1 (or 0 and 1 or upward and downward), an interaction coefficient showing interaction between spins and an external magnetic field coefficient for every spin. The Ising model enables calculating energy at that time on the basis of a provided spin array, interaction coefficients and an external magnetic field coefficient.

A search for a ground state of the Ising model is equivalent to an optimization problem for acquiring an array of spins that minimizes an energy function of the Ising model. It is known that the acquisition of a ground state of the Ising model which is a non-planar graph by topology is an NP-hard problem.

The search for a ground state of the Ising model is also equivalent, to a maximum cut problem known to be an NP-hard graph problem. Such a graph problem has broad applied skill to the detection of community in a social network, segmentation in image processing and others. Therefore, if a solver that searches for a ground state of the Ising model exists, the solver can be applied to such various problems.

Since there are a large number of the combinations of possible states of spins included in the Ising model, it is substantially impossible to search for all ground states in searching for a ground state. Therefore, to efficiently acquire a ground state, it is required to narrow down the combination of spins to be searched. However, since an evil effect also occurs that local optimum solution is selected by narrowing down and only an approximate ground state is acquired, a method of enabling acquiring better solution by avoiding local solution found in a process of a search is required.

For such a method, a method of searching for a ground state utilizing quantum fluctuation using a superconductive device is proposed. For example, for such a device, a device disclosed in Patent Literature 1 can be given.

Further, there is also a method of acquiring satisfactory solution using heuristics in which the deterioration of solution is temporarily allowed such as simulated annealing. When such a method is used, a ground state can be searched at high speed by using hardware disclosed in Nonpatent Literature 1 for example.

CITATION LIST

Patent Literature

Patent Literature 1: WO 2012/118064

Nonpatent Literature

Nonpatent Literature 1: Michael G. Wrighton, André M. DeHon, Hardware-Assisted Simulated Annealing with Application for Fast FPGA Placement, FPGA '03 Proceedings of the 2003 ACM/SIGDA eleventh international symposium of Field programmable gate arrays, Pages 33-42

SUMMARY OF INVENTION

Technical Problem

In a method of escaping from local solution utilizing quantum fluctuation using the superconductive device disclosed in Patent Literature 1, an advanced cooling system is required to be used because hardware that realizes a superconductive state is configured. Therefore, a problem occurs that the whole system requires a high cost and in addition, it is difficult to make the system large-scale.

As in the Nonpatent Literature 1, when a semiconductor device that performs simulated annealing is used, it is necessary to supply required randomness using a pseudorandom number generator. In this case, when a pseudorandom number generator is mounted in every arithmetic unit that performs basic operation of annealing so as to acquire parallelism of annealing operation, a problem that circuit scale is enlarged, a cost is increased and increase of scale is difficult occurs.

The present invention is made in view of the abovementioned problems and its object is to provide a semiconductor device which searches for a ground state of an Ising model, which is low-cost and increase of scale of which is facilitated by supplying randomness to the whole semiconductor device using an extremely few random number generators.

Solution to Problem

To settle the abovementioned problems, in the present invention, a semiconductor device that searches for a ground state of an Ising model is configured by a spin array where plural spin units respectively provided with a memory cell that stores a value of each spin of the Ising model, a memory cell that stores an interaction coefficient from an adjacent spin which interacts with the corresponding spin, a memory cell that stores an external magnetic field coefficient of the corresponding spin, and circuits that determine the next state of the corresponding spin are arranged and connected on a two-dimensional plane on a semiconductor substrate in a state in which topology of the Ising model is maintained, a random number generator that generates a plural-bit random number, a bit regulator that operates output of the random number generator and supplies random one bit having variable bit probability, and one wire that supplies output of the bit regulator to all spin units in the spin array.

Further, to settle the abovementioned problems, in the present invention, the bit regulator of the semiconductor device includes a bit selection unit that extracts only the number m of bits specified as the number m of operated bits from an input n-bit random number according to the number m of the operated bits stored in a memory, an AND circuit that ANDs each bit in an m-bit value which is output of the bit selection unit and outputs a 1-bit value, an OR circuit that ORs each bit of the m-bit value which is the output of the bit selection unit and outputs a 1-bit value, and an AND/OR selection unit that selects the output of the AND circuit or the OR circuit according to an AND/OR selecting bit stored in the memory and outputs the selected output as output of the whole bit regulator.

Moreover, to settle the abovementioned problems, in the present invention, the semiconductor device is configured so that the wire passes all the spin units in the spin array only once in a traversable path, a random bit is supplied to each spin unit via the wire, and each spin unit inverts a value of spin using a value of the random bit.

In addition, to settle the abovementioned problems, in the present invention, an information processing system where A CPU, a memory, an HDD and a semiconductor device applicable as an accelerator are connected to a system bus is configured so that the semiconductor device includes a spin array in which plural spin units respectively provided with a memory cell that stores a value of each pin of an Ising model, a memory cell that stores an interaction coefficient from an adjacent spin which interacts with the corresponding spin, a memory cell that stores an external magnetic field coefficient of the corresponding spin, and circuits that determine the next state of the corresponding spin are arranged and connected on a two-dimensional plane on a semiconductor substrate in a state in which topology of the Ising model is maintained, a random number generator that generates a plural-bit random number, a bit regulator that operates output of the random number generator and supplies random one bit having variable bit probability, one wire that supplies output of the bit regulator to all spin units in the spin array, and an I/O interface that reads/writes data from/to the memory cell of the spin unit arranged in the spin array, a problem conversion program executed in the CPU generates an interaction coefficient and an external magnetic field coefficient of the Ising model that represents an object problem, and a control program executed in the CPU of the semiconductor device generates an initial spin array at random, writes the initial spin array, the interaction coefficient and the external magnetic field coefficient to the spin unit to which each spin of the Ising model is allocated in the spin array in the semiconductor device, sets an initial value of bit probability of a random bit output from the bit regulator and a number of times of interaction corresponding to the bit probability, repeatedly executes a ground state search process of each of all spin units in the spin array by the set number of times of interaction, performs update for lowering bit probability and resetting of the number of times of interaction when the set bit probability does not reach a final lower limit threshold and repeatedly executes the ground state search process of the spin unit, reads a spin array of the spin unit that reaches the ground state and functions so as to acquire solution of the object problem.

Advantageous Effects of Invention

According to the present invention, as the semiconductor device that searches for a ground state of the Ising model can supply randomness by a few random number generators, the cost reduction and the extension in scale of the device are facilitated.

BRIEF DESCRIPTION OF DRAWINGS

FIG. 12 is a table showing one example of bit probability and a number of times of interaction when a ground state of the Ising model is searched.

DESCRIPTION OF EMBODIMENTS

Embodiments of the present invention will be described using examples of a semiconductor device that searches for a ground state of an Ising model below.

First Embodiment

An Ising model is a statistical-mechanical model used in explaining behavior of a ferromagnetic substance. The Ising model is defined by plural spins that take a binary state of +1 or −1, an interaction coefficient representing the intensity of interaction between spins, and an external magnetic field coefficient representing the intensity of an external magnetic field that acts on each spin.

In the Ising model, energy at that time can be calculated on the basis of a spin array, interaction coefficients and external magnetic field coefficients respectively provided.

An energy function $E(\sigma)$ of the Ising model is defined by the following mathematical expression 1. In the mathematical expression 1, $\sigma_i$ and $\sigma_j$ are values of i"th" and j"th" spins, $J_{i,j}$ is an interaction coefficient between the i"th" and j"th" spins, $J_{i,j}$ is a coefficient of an external magnetic field that acts on the i"th" spin, <i, j> is combination of adjacent all spins (i and j), and σ represents an array of spins.

[Mathematical expression 1]

$$E(\sigma) = -\sum_{\langle i,j \rangle} J_{i,j}\sigma_i\sigma_j - \sum_i h_i\sigma_i$$

A search for a ground state of the Ising model is equivalent to solving a combination optimization problem for searching for the combination of such spin values that the energy function of the Ising model expressed in the mathematical expression 1 is minimum.

For example, an optimization problem that a maximum cut problem of a graph and a traveling salesman problem can be converted to a search for a ground state of the Ising model. At this time, the original problem can be solved by conversely converting a spin value to the original problem after obtaining a ground state of the Ising model acquired by converting the original problem. The optimization problem that requires much time in a conventional type computer can be solved at high speed by using a device that searches for a ground state of the Ising model at high speed.

Figure 1:
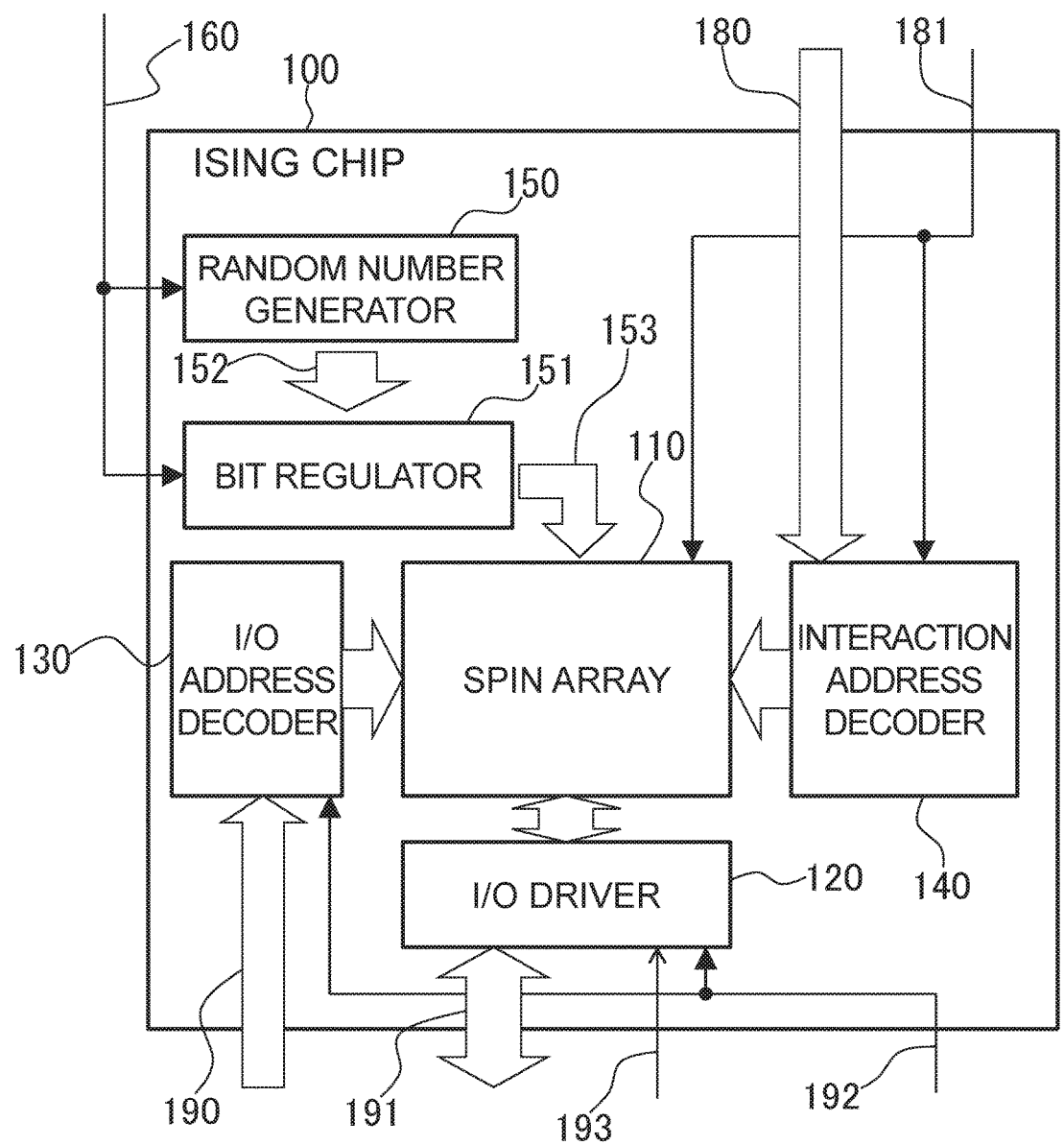
FIG. 1 illustrates one example of a configuration of an Ising chip which is a semiconductor device according to the present invention.

FIG. 1 shows an example of the configuration of an Ising chip which is the semiconductor device that searches for a ground state of the Ising model.

The Ising chip 100 is configured by a spin array 110, an I/O driver 120, an I/O address decoder 130, an interaction address decoder 140, a random number generator 150, and a bit regulator 151.

Figure 3:
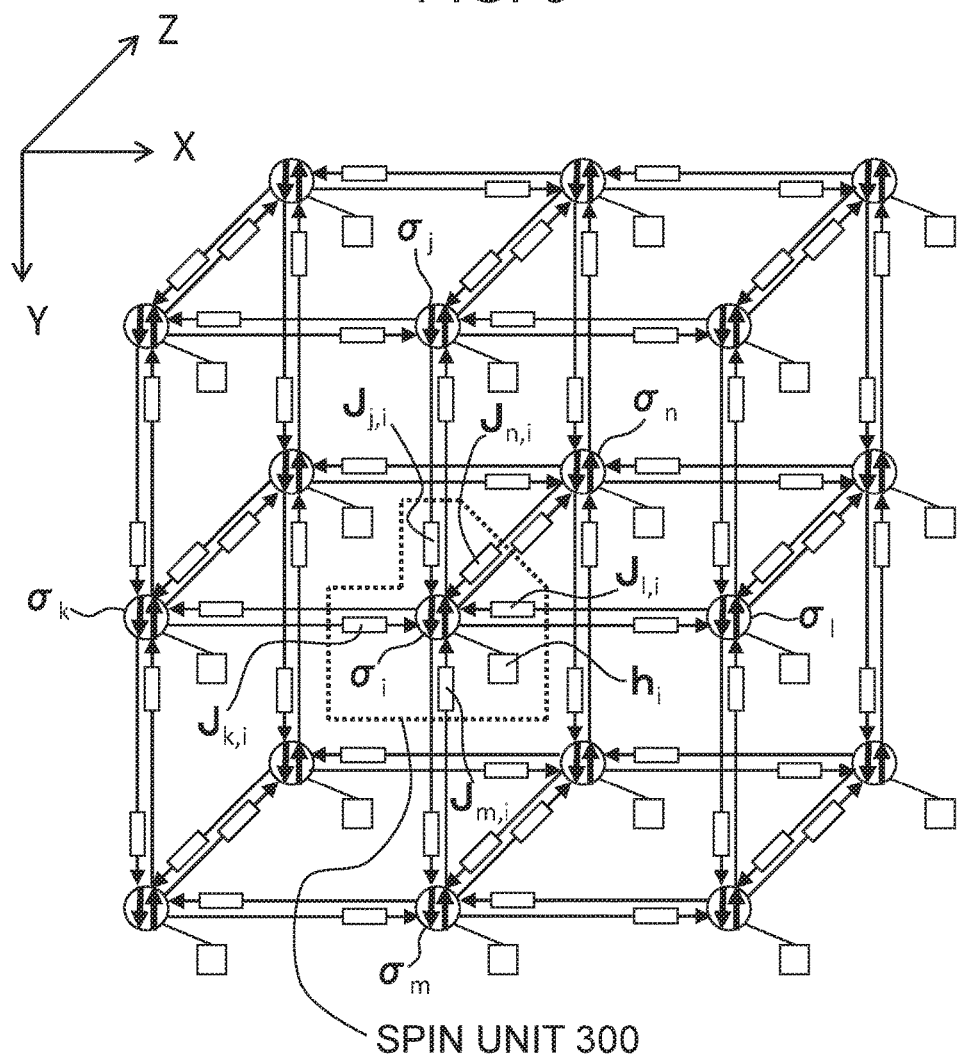
FIG. 3 illustrates one example of a configuration of a three-dimensional grid-like spin array.
Figure 4:
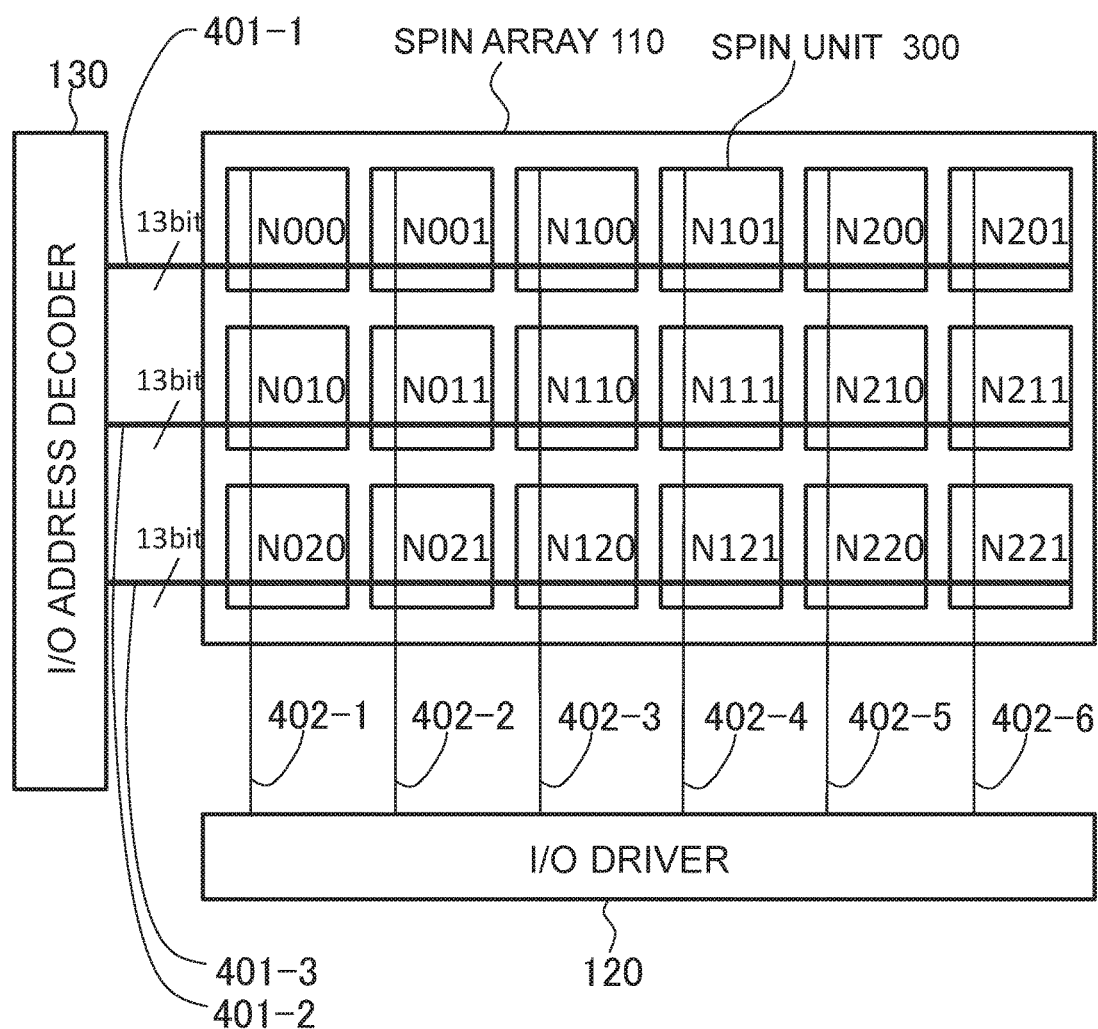
FIG. 4 illustrates the configuration of the spin array in terms of operation as an SRAM memory.

The spin array 110 has a spin unit 300 that holds one spin, an interaction coefficient and an external magnetic field coefficient respectively accompanied with the one pin, realizes a ground state search process and realizes a ground state search process as a unit of basic configuration, and multiple spin units 300 are arranged in the spin array as shown in FIGS. 3 and 4 described later. The spin array 110 has both a function as SRAM and a function as an interaction circuit that performs a ground state search of the Ising model.

The I/O driver 120 and the I/O address decoder 130 are an interface when the spin array 110 is used for SRAM. The I/O driver 120 transmits/receives a bit string for reading or writing to/from the spin array 110 via a data bus 191 and can switch reading operation and writing operation according to a signal via an R/W control line 193. The I/O address decoder 130 maps an address for reading or writing via an address bus 190. The I/O driver 120 and the I/O address decoder 130 are both operated in a state in which they are synchronized with an I/O clock 192.

In the Ising chip 100, the spin $\sigma_i$ of the Ising model, the interaction coefficient $J_{i,j}$ and the external magnetic field coefficient $h_i$ are all represented as information stored in memory cells in the spin array 110. The abovementioned SRAM-compatible interfaces read/write a value of the spin $\sigma_i$ for setting an initial state of the spin and reading solution after the search for a ground state is completed. Further, to set the Ising model its ground state of which is to be searched in the Ising chip 100, the SRAM-compatible interfaces also read/write the interaction coefficient $J_{i,j}$ and an external magnetic field coefficient $h_i$.

Moreover, the Ising chip 100 realizes interaction between spins inside the spin array 110 to search for a ground state. To control this interaction from an external device, an interaction address 180 which is an address for specifying a spin group that performs interaction is input from the external device and the interaction address decoder 140 selects spins to be a target of interaction when the spin array 110 is used for an interaction circuit. In addition, the interaction address decoder 140 and the spin array 110 are operated in synchronization with an interaction clock 181 and perform interactive operation once per cycle of the interaction clock. The details of the interactive operation will be described later.

Further, the random number generator 150 generates a random number 152 configured by plural bits per generation of a random number. For the random number generator, a pseudo-random number circuit such as a linear feedback register which can be readily realized as an electronic circuit may also be used and a physical random number generator may also be used. The bit regulator 151 generates a random bit 153 of one bit by receiving a random number 152 output from the random number generator 150 and performing suitable operation and outputs the random bit to the spin array 110. The random number generator 150 and the bit regulator 151 are both operated in synchronization with a random number generation clock 160 and generate one random number 153 per cycle of the random number generation clock.

In this embodiment, the example including the random number generator 150 and the bit regulator 151 in the Ising chip 100 is described; however, the random number generator 150 and the bit regulator 151 are arranged outside the chip, and a random bit string may also be input to the Ising chip 100.

Figure 2:
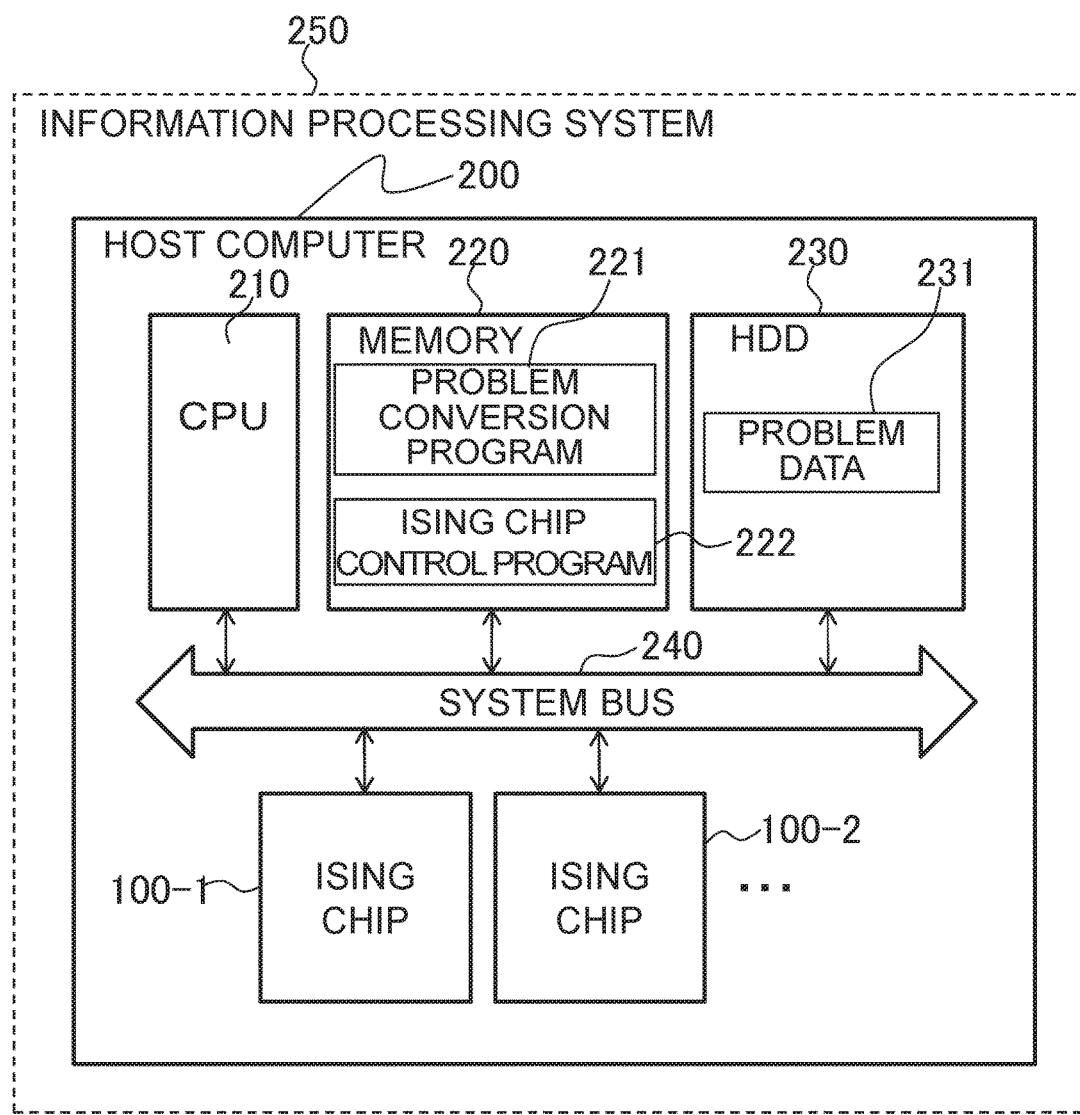
FIG. 2 illustrates one example of a configuration of an information processing system that controls the Ising chip which is the semiconductor device according to the present invention.

FIG. 2 shows one example of an information processing system for solving a desired optimization problem using the abovementioned Ising chip 100. The information processing system 250 includes a host computer 200 such as a personal computer and a server respectively generally used. The host computer 200 is provided with CPU 210, a memory 220, HDD 230, a system bus 240 and one or plural Ising chips 100-1, 100-2 as an accelerator.

The memory 220 stores a problem conversion program 221 that converts a desired optimization problem to searching for a ground state of the Ising model and an Ising chip control program 222 that controls the Ising chip so as to search for the ground state of the Ising model. The programs stored in the memory 220 are executed by the CPU 210. The HDD 230 stores problem data 231 representing the desired optimization problem. The CPU 210 controls the Ising chip 100 via the system bus 240 and reads/writes data from/to the spin array in the Ising chip 100.

FIG. 3 shows an example in which the Ising model having three-dimensional grid-like topology is configured by arranging plural spin units 300 each of which is the unit of basis configuration of the spin array 110. The example shown in FIG. 3 shows a three-dimensional grid having size of 3 (in an X-axis direction)×3 (in a Y-axis direction)×2 (in a Z-axis direction). The size of the three-dimensional grid is arbitrary. In this embodiment, however, a configuration in which a case that the number of spins in the z-direction is 2 is supposed is shown. For the definition of coordinate axes, the X-axis is directed rightward in the drawing, the Y-axis is directed downward in the drawing, and the Z-axis is directed to a direction of the depth in the drawing as respectively shown in the drawing; however, these coordinate axes are necessary only for convenience for the explanation of the embodiment and are unrelated to the present invention. When topology except the three-dimensional grid, for example, tree-structure topology and others are utilized, the configuration is represented by the number of stages of a tree and others in place of the coordinate axes. In the three-dimensional grid-like topology shown in FIG. 3, spin (a vertex) maximally having order of 5 is required when interaction between spins is grasped as a graph. When connection of the external magnetic field coefficient is also included, order of 6 at maximum is required.

Values of adjacent spins (for example, a case that the number of adjacent spins is 5) $\sigma_j$, $\sigma_k$, $\sigma_l$, $\sigma_m$, $\sigma_n$ are input to one spin unit 300 shown in FIG. 3. Further, the spin unit 300 is provided with a memory cell that holds $J_{j,i}$, $J_{k,i}$, $J_{l,i}$, $J_{m,i}$, $J_{n,i}$ (interaction coefficients between $\sigma_i$ and any of the adjacent 5 spins) which are respectively the interaction coefficient between the adjacent spins in addition to the spin $\sigma_i$ and the external magnetic field coefficient $h_i$.

The Ising model used in statistical mechanics is provided with interaction generally represented by an undirected graph. The mathematical expression 1 includes $J_{i,j} \times \sigma_i \times \sigma_j$ for a term representing interaction; however, this denotes interaction from the i"th" spin to the j"th" spin. At this time, in a general Ising model, interaction from the i"th" spin to the j"th" spin and interaction from the j"th" spin to the i"th" spin are not discriminated. That is, $J_{i,j}$ and $J_{j,i}$ are the same there. However, in the Ising chip 100 according to the present invention, it is realized that this Ising model is extended to a directed graph and interaction from the i"th" spin to the j"th" spin and interaction from the j"th" spin to the i"th" spin are asymmetrical. Hereby, the expressiveness of the model is enhanced and many problems can be represented by a small-scale model.

Therefore, when one spin unit 300 is supposed to be the i"th" spin $\sigma_i$, "$J_{j,i}, J_{k,i}, J_{l,i}, J_{m,i}, J_{n,i}$," which are interaction coefficients held by this spin unit determine each interaction from the adjacent j"th", k"th", l"th", m"th" and n"th" spins $\sigma_j, \sigma_k, \sigma_l, \sigma_m, \sigma_n$ to the i"th" spin $\sigma_i$. This is represented by an illustration in FIG. 3 showing that arrows (interaction) corresponding to the interaction coefficients included in the spin unit 300 are directed from the spins shown in FIG. 3 outside the spin unit 300 to the spin inside the spin unit 300.

Figure 5:
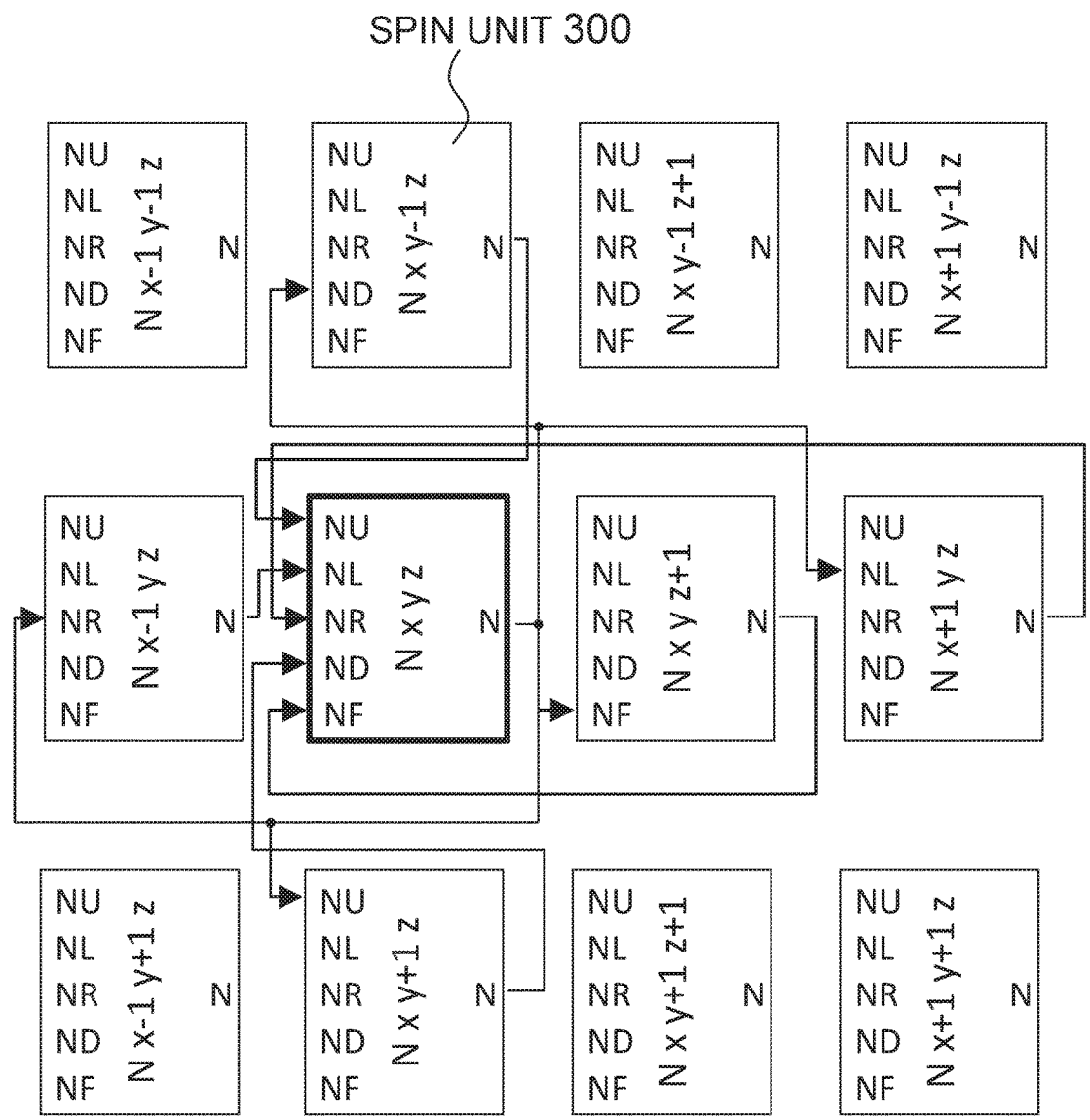
FIG. 5 illustrates the configuration of the spin array in terms of operation for performing interaction between spin units.
Figure 6:
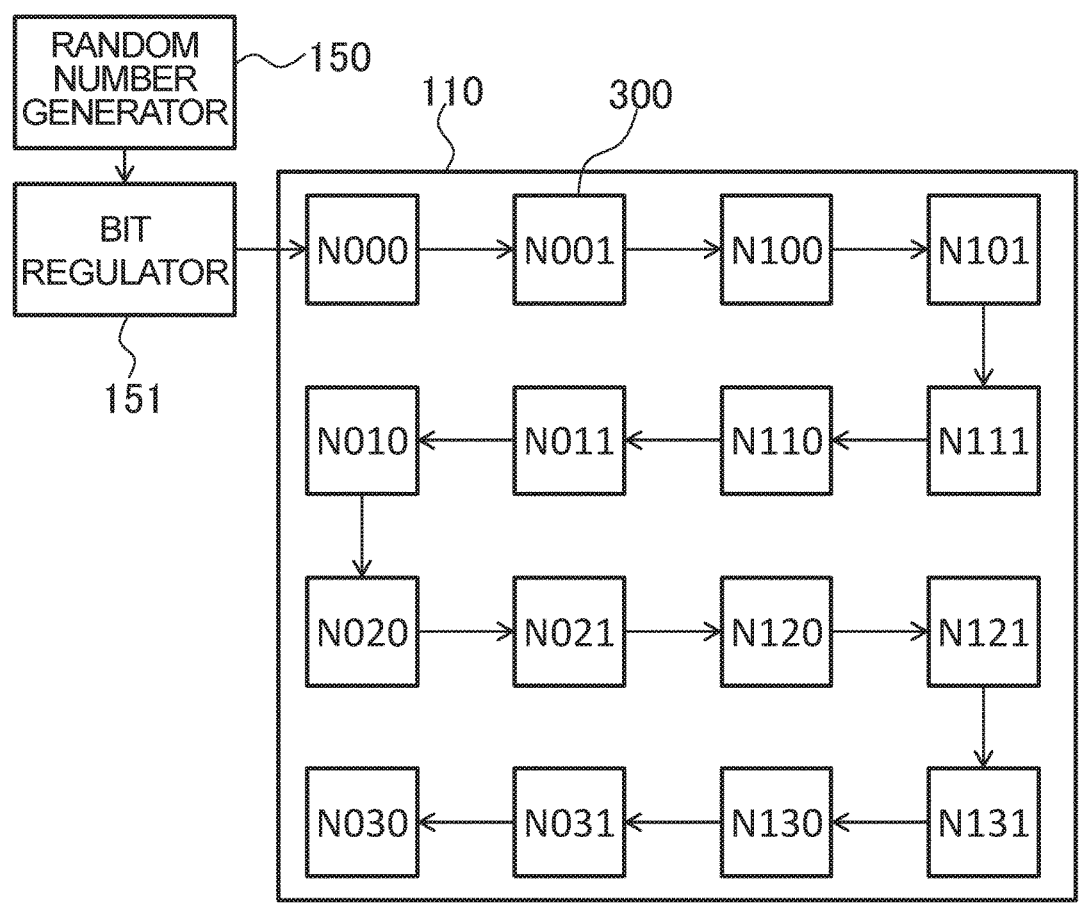
FIG. 6 illustrates the configuration of the spin array in terms of a propagation path of random bits.

Referring to FIGS. 4, 5 and 6, the configuration of the spin array 110 will be described below. For the convenience of explanation, the configuration is shown in three drawings; however, as described above, the spin array 110 is provided with both a function as SRAM and a function as a circuit for performing interaction and actually, simultaneously includes all components.

FIG. 4 shows configuration of the spin array 110 focused on operation as SRAM. The spin array 110 includes the multiple spin units 300 arranged on a plane of a semiconductor substrate. Each spin unit 300 shown in FIG. 4 is named after coordinates corresponding to topology of the Ising model shown in FIG. 3. For example, "N021" denotes the spin unit the x-coordinate of which is 0, the y-coordinate of which is 2 and the z-coordinate of which is 1. As shown in FIG. 3, the topology of the Ising model is three-dimensional grid-like; however, when the Ising model is realized as a semiconductor device, the Ising model in which spin units are arrayed on the plane can be more readily manufactured. Then, in this embodiment, spin units the z-coordinate of each of which is 0 and 1 are alternately arranged in the X-axis direction of the spin array.

Each spin unit 300 is connected via the I/O address decoder 130 and a word line 401. As each spin unit 300 includes 13 memory cells that hold a value of spin, an interaction coefficient and an external magnetic field coefficient, the 13-bit word line is connected to one spin unit 300. The details of the configuration of the single spin unit 300 will be described later. Further, each spin unit 300 is connected via the I/O driver 120 and a 1-bit word line 402.

FIG. 5 shows configuration of the spin array 110 focused on operation as the interaction circuit. Each spin unit 300 is provided with connection for inputting/outputting values of spins between adjacent spin units in the three-dimensional grid-like topology so as to acquire an interaction coefficient. In FIG. 5, a spin unit (Nxyz) shown by a thick line is focused and only connection related to Nxyz is shown. NU, NL, NR, ND and NF represent spin values input from adjacent spin units. Respectively to the spin unit (Nxyz), NU represents input from the spin unit the y-coordinate of which is smaller by 1 and which is located on the upside, NL represents input from the spin unit the x-coordinate of which is smaller by 1 and which is located on the left side, NR represents input from the spin unit the x-coordinate of which is larger by 1 and which is located on the right side, ND represents input from the spin unit the y-coordinate of which is larger by 1 and which is located on the downside, and NF represents input from the spin unit different in the z-coordinate and located on the side of the depth. In this embodiment, since the number of spins in the Z-axis direction of the Ising model is set to 2, only one line is required for connection in the Z-axis direction. In the meantime, N shows a value output from the spin unit and the same value is output to the spin units on the vertical sides, on the lateral sides and on the side of the depth.

A search for a ground state of the Ising model that minimizes energy by interaction between spins can be realized on the basis of the connection among the spin units 300 shown in FIG. 5. In the case of only this, however, the search may lapse into local optimum solution. Therefore, for means for escaping from the local optimum solution and reaching a global optimum solution, FIG. 6 shows configuration of the spin array 110 focused on a path for propagating a random bit string output from the random number generator 150 and the bit regulator 151. The bit regulator 151 generates a random bit of 1-bit width and inputs it to the spin unit at a left upper corner of the spin array 110, for example. Each spin unit stores a logical level of the input random bit in a buffer and outputs it to the adjacent spin unit. As described above, the input random bits are propagated to all the spin units via such the traversable path shown in FIG. 6. The propagation of the random bits is asynchronously performed and delay until the random bit output from the bit regulator reaches each spin unit 300 is extended depending upon the number of the passed spin units until the random bit reaches from the bit regulator to the corresponding spin unit.

Figure 7:
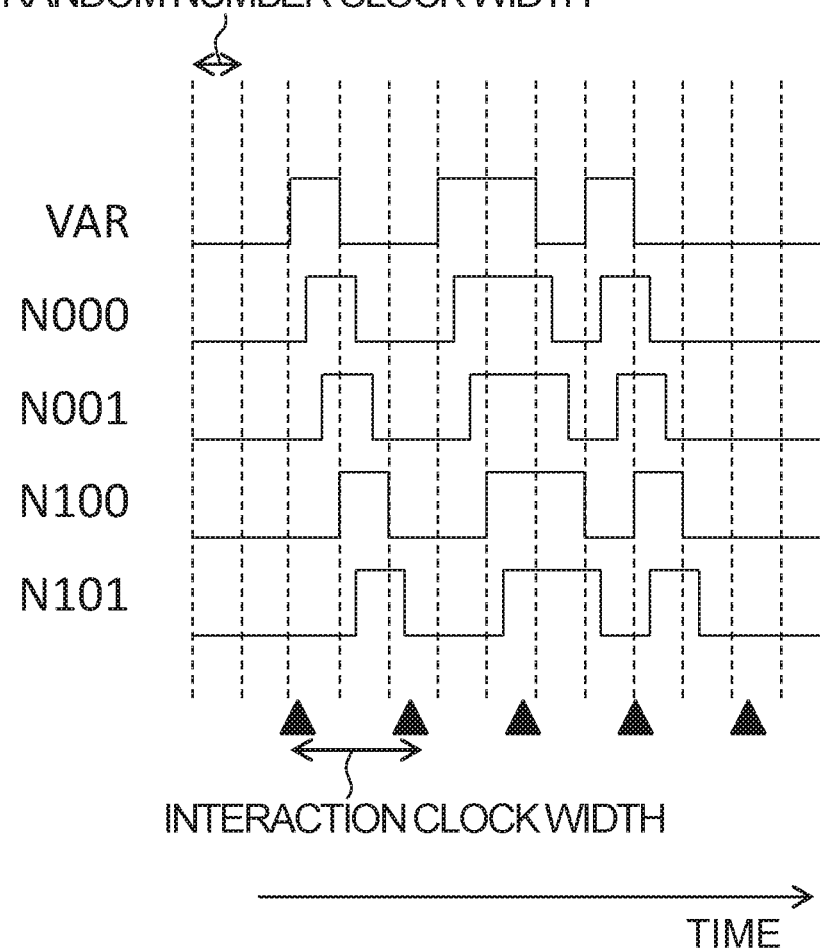
FIG. 7 shows a manner in which random bits are propagated in the spin unit according to time series.

FIG. 7 shows a manner in which the random bit string is propagated in the spin units 300. VAR shown in FIG. 7 denotes a random bit output from the bit regulator 151. N000, N001, N100 and N101 denote a random bit input to respective spin units 300. The bit regulator 151 outputs a new random bit every time interval defined by random number clock width. The random bit slightly delayed from VAR is input to N000 and the random bit further slightly delayed from N000 is input to N001.

In the meantime, interaction in each spin unit 300 is performed at timing shown by ▲ for every time interval defined by interaction clock width. Each spin unit fetches the random bit that reaches itself when interaction is performed and uses it for calculating interaction. The random number clock width and the interaction clock width are not necessarily required to be the same and may also be interdependently set.

Figure 8:
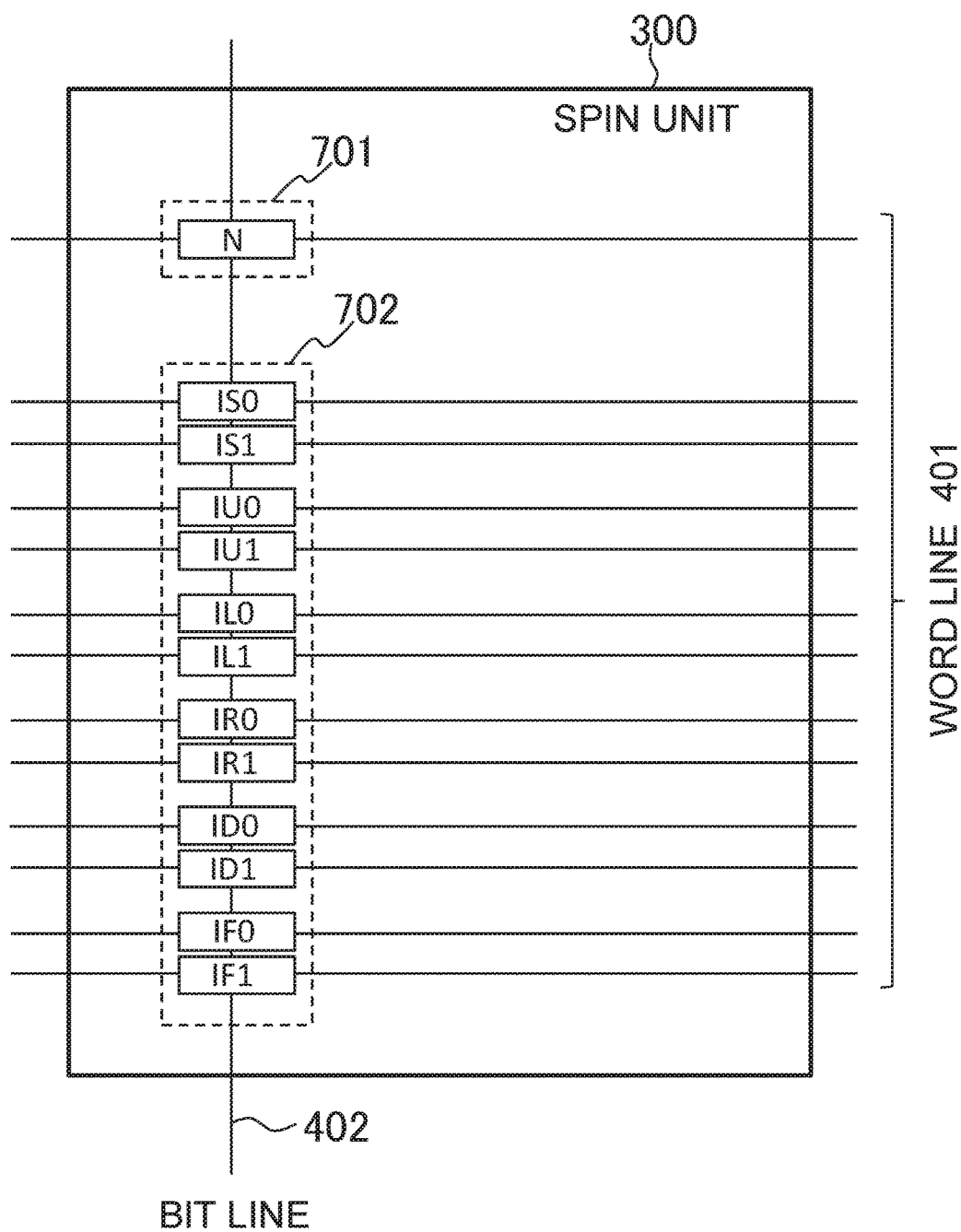
FIG. 8 illustrates a configuration of the spin unit in terms of operation as an SRAM memory.
Figure 9:
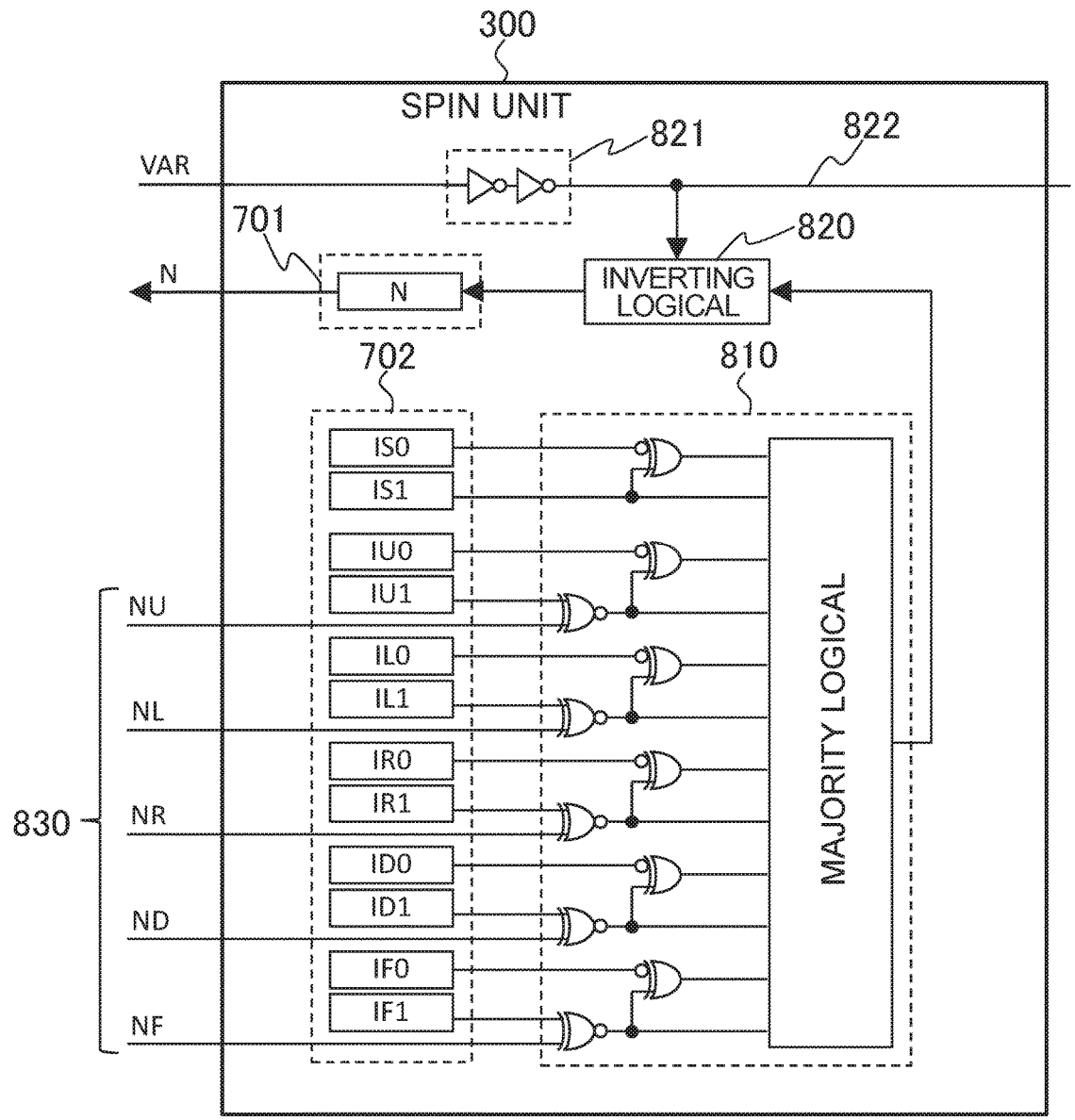
FIG. 9 illustrates the configuration of the spin unit in terms of operation for performing interaction.

Referring to FIGS. 8 and 9, the configuration of the spin unit 300 will be described below. For the convenience of explanation, the configuration is divided in the two drawings; however, the spin unit 300 which is actually one simultaneously includes all components.

FIG. 8 shows the configuration of the spin unit 300 when operation as SRAM is focused. The spin unit 300 includes a memory 701 that holds a value of spin and a memory 702 that holds an external magnetic field coefficient and an interaction coefficient. The memory 702 holds the following coefficient information. IS0 and IS1 hold an external magnetic field coefficient of this spin. IU0 and IU1 hold an interaction coefficient received from a spin adjacent on the upside of this spin. IL0 and IL1 hold an interaction coefficient received from a spin adjacent on the left side of this spin. IR0 and IR1 hold an interaction coefficient received from an adjacent spin on the right side of this spin. ID0 and ID1 hold an interaction coefficient received from a spin adjacent on the downside of this spin. IF0 and IF1 hold an interaction coefficient received from a spin adjacent in a direction of the depth of this spin.

An address signal output from the I/O address decoder 130 is input to each memory via the word line 401 and the memory cell is selected. The I/O driver 120 reads data in the memory cell selected via the bit line 402 or writes data to the memory cell.

FIG. 9 shows the configuration of the spin unit 300 when operation as an interaction circuit is focused.

The spin unit 300 is provided with plural 1-bit memory cells so as to hold the spin $\sigma_i$ of the Ising model, the interaction coefficient. $J_{j,i}, \text{---} J_{n,i}$ and the external magnetic field coefficient $h_i$. These 1-bit memory cells are shown, as N (701), IS0, IS1, IU0, IU1, IL0, IL1, IR0, IR1, ID0, ID1, IF0, IF1 (702) in FIGS. 8 and 9. Since IS0 and IS1, IU0 and IU1, IL0 and IL1, IR0 and IR1, ID0 and ID1, and IF0 and IF1 fulfill each role in one pair configured by two respectively described above, respective pairs are abbreviated as ISx, IUx, ILx, IRx, IDx and IFx.

The memory cell N is a memory cell for representing the spin $\sigma_i$ and holds a value of the spin. The value of the spin is +1 or −1 (+1 is also represented as upward and −1 is also represented as downward) in the Ising model; however, these values are made to correspond to 0 and 1 which are a binary of the memory cell. For example, +1 is made to correspond to 1 and −1 is made to correspond to 0.

Figure 17:
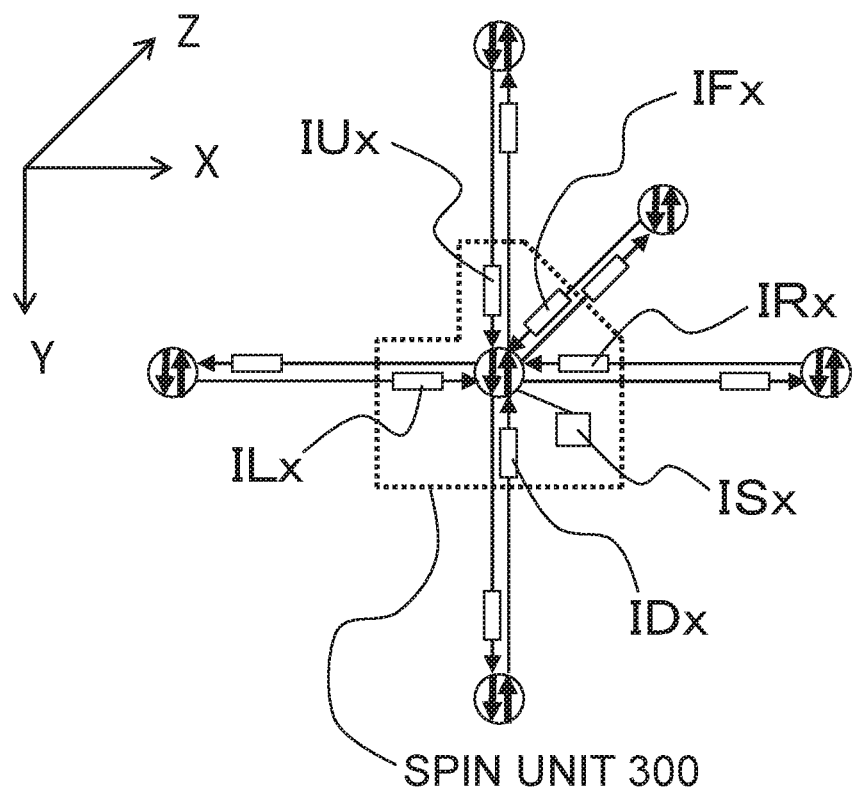
FIG. 17 illustrates correspondence between a memory cell in a spin unit and topology of a spin array.

FIG. 17 shows a correlation between the memory cells with which the spin unit 300 is provided and the topology of the Ising model shown in FIG. 3. The ISx represents the external magnetic field coefficient. Further, the IUx, the ILx, the IRx, the IDx and the IFx represent respective interaction coefficients. The IUx denotes the interaction coefficient with the spin on the upside (−1 in the Y-axis direction), the ILx denotes that with, the spin on the left side (−1 in the X-axis direction), the IRx denotes that with the spin on the right side (+1 in the X-axis direction), the IDx denotes that with the spin on the downside (+1 in the Y-axis direction), and the IFx denotes that with the spin connected in the direction of the depth (+1 or −1 in the Z-axis direction).

The Ising chip 100 in this embodiment corresponds to a ternary of +1, 0 and −1 for an external magnetic field coefficient and an interaction coefficient. Therefore, to represent the external magnetic field coefficient and the interaction coefficient, memory cells of 2 bits are respectively required. The ISx, IUx, ILx, IRx, IDx, and IFx represent the ternary of +1, 0 and −1 in the combination of the two memory cells (the IS0 and the IS1 in the case of the ISx for example) the digit in each end of which is 0 and 1. For example, in the case of the ISx, +1 or −1 is represented in the IS1, when the IS1 is 1, ISx is represented as +1, and when the IS1 is 0, the ISx is represented as −1. In addition, when the IS0 is 0, the external magnetic field coefficient is regarded as 0, and when the IS0 is 1, either +1 or −1 determined in the IS1 shall be the external magnetic field coefficient. Assuming that the external magnetic field coefficient is disabled when the coefficient is 0, it can be said that the IS0 is an enable bit of the external magnetic field coefficient (when IS0=1, the external magnetic field coefficient is enabled). As for the IUx, ILx, IRx, IDx and IFx that represent the interaction coefficient, the coefficient and a value of the bit are similarly made to correspond.

The spin unit 300 is provided with an interaction circuit 810 for determining the next state of the spin on the basis of a spin value 830, the interaction coefficient and the external magnetic field coefficient 702 of the adjacent spin unit as shown in FIG. 9. The interaction circuit 810 is configured by logical operation elements that calculate an effect from an adjacent spin and a majority logical circuit that totalizes effects from each adjacent spin and determines a final spin value. The interaction circuit 810 calculates a value of spin (the next state of spin) for the next spin itself to take so that local energy is minimum.

In the spin unit 300, the next state of spin is determined so that energy between the corresponding spin and adjacent spin is minimum; however, it is equivalent to judging which of a positive value or a negative value is dominant in terms of a product of the adjacent spin and an interaction coefficient and an external magnetic field coefficient. For example, when it is supposed that the spins $\sigma_j, \sigma_k, \sigma_l, \sigma_m, \sigma_n$ are adjacent to the "i"th spin $\sigma_i$, the next state of the spin $\sigma_i$ is determined as follows. First, suppose that values of the adjacent spins are $\sigma_j=+1, \sigma_k=−1, \sigma_l=+1, \sigma_m=−1$ and $\sigma_n=+1$, the interaction coefficients are $J_{j,i}=+1, J_{k,i}=+1, J_{l,i}=+1, J_{m,i}=−1$ and $J_{n,i}=−1$, and the external magnetic field coefficient, is $h_i=+1$. At this time, when the product of the interaction coefficient of the corresponding adjacent spin and the external magnetic field coefficient are respectively arranged, $\sigma_j \times J_{j,i}=+1, \sigma_k \times J_{k,i}=−1, \sigma_l \times J_{l,i}=+1, \sigma_m \times J_{m,i}=+1, \sigma_n \times J_{n,i}=−1$, and $h_i=+1$. The external magnetic field coefficient may also be interpreted as an interaction coefficient related to spin having constantly a value of +1.

In this case, local energy between the "i"th spin and the adjacent spin is acquired by respectively multiplying the abovementioned coefficients by the value of the ith spin and further inverting signs. For example, since local energy between the "i"th spin and the "j"th spin is −1 when the ith spin is +1 and is +1 when the ith spin is −1, the local energy here is reduced when the ith spin is +1. It is calculated which of +1 or −1 as the value of the "i"th spin can reduce energy when such local energy is considered as to between all adjacent spins and its external magnetic field coefficient. In the arrangement of the product of the interaction coefficient and the adjacent spin and the external magnetic field coefficient respectively described above, this has only to count which of +1 or −1 is greater in a number. In the abovementioned example, there are four "+1" and two "−1". If the "i"th spin is +1, the sum of energy is −2 and if the ith spin is −1, the sum of energy is +2. Therefore, the next state of the "i"th spin that minimizes energy can be determined according to majority decision that the next state of the ith spin is set as +1 when the number of +1 is great and the next state of the ith spin is set as −1 when the number of −1 is great.

The logical circuits shown in FIG. 9 in the spin unit 300 are the abovementioned circuit for performing interaction. First, the next state of spin that minimizes energy in terms of only its interaction can be calculated by negation (XNOR) of the exclusive-OR of a state of adjacent spin and a memory cell showing +1 or −1 of an interaction coefficient (+1 shall be encoded as 1 and −1 shall be encoded as 0). If interaction coefficients include only +1 and −1, the next state of the spin can be determined by determining which of +1 or −1 is greater in a number out of output by majority logic. As for the external magnetic field coefficient, if it is considered to be constantly equivalent to an interaction coefficient with spin a state of which is +1, a value of the external magnetic field coefficient is merely a value to be input to the majority logical circuit that determines the next state of spin.

Next, a method of realizing a coefficient 0 will be described. When there is majority logic $f(I_1, I_2, I_3, \text{---}, I_n)$ having "n" inputs, it can be said that the following proposition is true. First, suppose that there is a duplicate $I'_1, I'_2, I'_3, \text{---}, I'_n$ of the input $I_1, I_2, I_3, \text{---}, I_n$ (as to arbitrary "k", $I_k=I'_k$). At this time, the output of $f(I_1, I_2, I_3, ---, I_n)$ is equal to $f(I_1, I_2, I_3, ---, I_n, I'_1, I'_2, I'_3, ---, I'_n)$ to which the duplicate is input together. That is, even if each two input variables are input, the output is unchanged. Further, suppose that there are another input $I_x$ and its inversion $!I_x$ in addition to the input $I_1, I_2, I_3, ---, I_n$. At this time, the output of $f(I_1, I_2, I_3, ---, I_n, I_x, !I_x)$ is equal to $f(I_1, I_2, I_3, ---, I_n)$. That is, when the input variable and its inversion are input, an effect by the input variable is canceled in majority decision. The coefficient 0 is realized utilizing this property of the majority logic. Concretely, a duplicate or inversion of a value to be a candidate of the abovementioned spin next state is simultaneously input to the majority logical circuit on the basis of a value of a bit (IS0 and others) that determines enablement of coefficients utilizing XOR as shown in FIG. 9. For example, in a case that IS0 stores 0, since a value in IS1 and an inverted value of the value in IS1 are simultaneously input to the majority logical circuit, an external magnetic field coefficient has no effect (the external magnetic field coefficient is equivalent to 0). Further, in a case that IS0 stores 1, the value in IS1 and the same value (a duplicate) as the value are simultaneously input to the majority logic circuit.

To realize searching for a ground state of the Ising model, interaction between spins is required to be realized so that energy of the whole Ising model transfers to be a lower spin array in energy. The interaction for this is performed on the basis of input interaction coefficient and external magnetic field coefficient by the abovementioned interaction circuit 810 shown in FIG. 9. That is, the next value of certain spin is determined on the basis of interaction from another spin connected to the spin, an interaction coefficient which the spin has and an external magnetic field coefficient. At this time, the next value of the spin is turned a value that minimizes local energy in a range in which the spin is connected.

For update of this spin, it is first conceivable that respective spins are sequentially updated one at a time; however, it takes time proportional to the number of spins by this method and parallelism cannot be utilized. Then, it is desirable that interaction between spins is concurrently performed as to all spins.

However, since spins are updated so that energy between adjacent spins is minimum in consideration of a value of the adjacent spin in updating certain spin in a trial of the simultaneous update of all spins, both updates are overlapped when the value of the adjacent spin is updated at the same time as that and oscillation is caused without the minimization of energy. That is, when certain spin is updated, spins connected to the spin (the spins directly connected to the certain spin via an interaction coefficient are hereinafter called adjacent spins) cannot be simultaneously updated.

Then, in this embodiment, the spin units 300 in the spin array 110 are grouped so that adjacent spins are not simultaneously updated and only one group shall be simultaneously updated. In the topology shown in FIG. 3, the spin units may also be grouped in two. These two groups are alternatively updated. To specify the group updated at certain timing, the Ising chip 100 is provided with the interaction address 180 as an input interface. The interaction address 180 is an interface for specifying the updated group out of the abovementioned groups and spins (the spin units 300) which belong to the group specified by the interaction address 180 are simultaneously updated by the input of the interaction clock 181.

According to this method, hardware is not required to be added into the spin unit 300 and one pair of interaction address decoders 140 have only to be provided to the whole Ising chip 100. Therefore, the abovementioned problem can be settled without making the spin unit 300 as a constitutional unit intricate.

A search for a ground state of the applied Ising model can be realized by minimizing energy by the abovementioned interaction between spins; however, there is capability that only local optimum solution may be acquired by only the minimization. Basically, as only the reduction of energy is possible, escape from the local optimum solution becomes impossible when the search is once led to the local optimum solution and the search does not reach global optimum solution. Therefore, for action for escaping from the local optimum solution, a spin array is varied at random by providing an inverting logical circuit 820 for inverting a value of the next spin immediately after the interaction circuit 810 calculates the random bit VAR as input in the spin unit 300 as shown in FIG. 9.

A random bit is generated at a time interval of random number clock width by the random number generator 150 and the bit regulator 151 respectively shown in FIG. 6 and is propagated via a random bit line 822 shown in FIG. 9.

A buffer 821 receives the random bit from the former adjacent spin unit via the random bit line 822 and outputs the same bit value to the next adjacent spin unit via the random bit line 822.

The inverting logical circuit 820 receives an output result of the interaction circuit 810 and the random bit from the random bit line 822, writes the output result of the interaction circuit 810 as it is to the memory 701 when the random bit is 0, and writes a value acquired by inverting the output result of the interaction circuit 810 to the memory 701 when the random bit is 1. Owing to the inverting logical circuit 820, as the value of the spin can vary in a direction in which local energy increases, escape from local solution is enabled.

Figure 10:
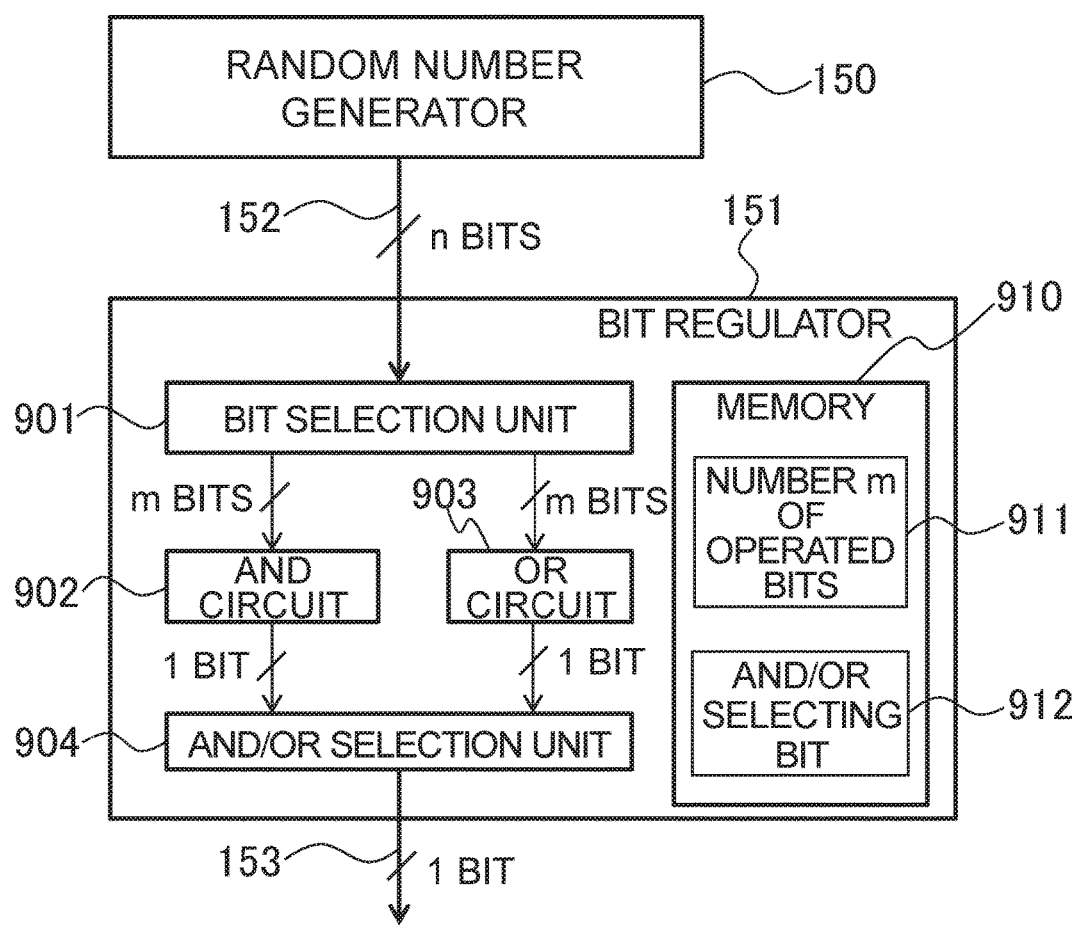
FIG. 10 illustrates a configuration of a bit regulator.

FIG. 10 shows configuration of the bit regulator 151. The random number generator 150 outputs an unbiased random number 152 of n-bit width. In this case, "unbiased" means that the probability of occurrence of 0 and 1 is equal as to each bit of the generated random number when sufficiently many random numbers are generated.

The bit regulator 151 is provided with a bit selection unit 901, an AND circuit 902, an OR circuit 903, an AND/OR selection unit 904 and a memory 910. The memory 910 stores the number of operated bits 911 and an AND/OR selecting bit 912. The bit regulator 151 receives an n-bit random number generated by the random number generator 150 and inputs it to the bit selection unit 901. The bit selection unit 901 extracts only m bits shown by the number of operated bits 911 in the input n-bit random number and inputs the bits to the AND circuit 902 and the OR circuit 903. The AND circuit 902 ANDs each bit in a value of the input m bits and outputs a value of one bit acquired as a result. The OR circuit 903 similarly ORs each bit in the value of the m bits and outputs a value of one bit acquired as a result. The AND/OR selection unit 904 selects the output of the AMD circuit 902 or the output of the OR circuit 903 on the basis of a value of the AND/OR selecting bit 912 and outputs the selected output as the output 153 of the whole bit regulator 151.

The bit regulator 151 can control probability that 1 appears in an output bit string by varying the values of the number of operated bits 911 and the AND/OR selecting bit 912. Hereinafter, the probability that 1 appears in the bit string is merely called bit probability. Bit probability output by the bit regulator 151 is acquired according to the following mathematical expressions 2, 3.

$$P=2^{-m} \quad \text{[Mathematical expression 2]}$$

$$P=1-2^{-m} \quad \text{[Mathematical expression 3]}$$

In the mathematical expressions 2, 3, P denotes bit probability and m denotes the number of bits to be operated. The mathematical expression 2 expresses bit probability when AND operation is selected. The mathematical expression 3 expresses bit probability when OR operation is selected.

Figure 11:
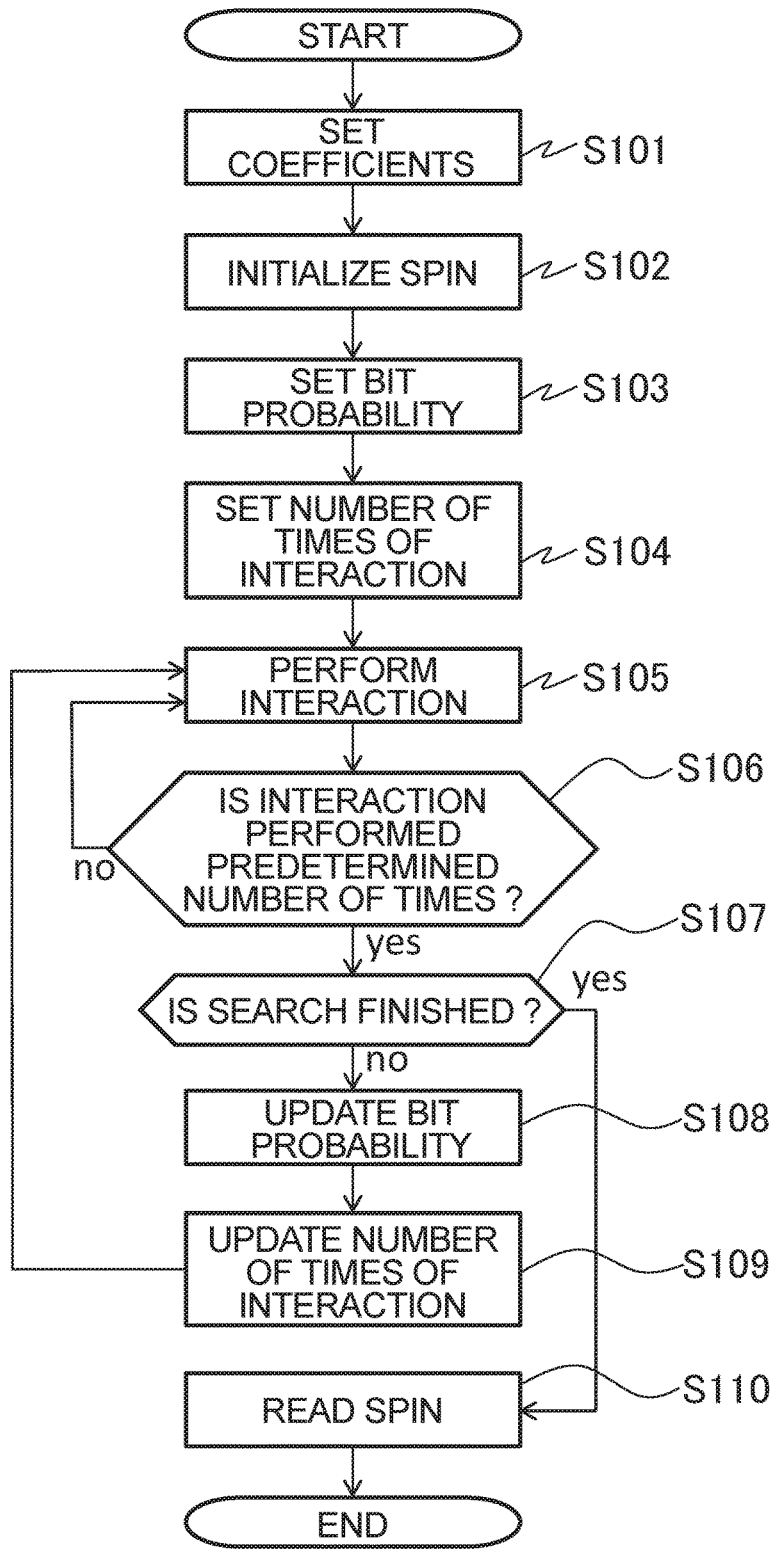
FIG. 11 illustrates a flow when an optimization problem is solved using the Ising chip.

FIG. 11 shows one example of a flowchart when the optimization problem is solved using the Ising chip 100. This flow is executed in the information processing system 250 shown in FIG. 2.

In a step S101, the CPU 210 executes the problem conversion program 221 and converts the optimization problem to be solved to the Ising model. The CPU writes an interaction coefficient and an external magnetic field coefficient respectively acquired as a result to the corresponding memory cell 702 of the spin unit 300 in the Ising chip 100 using the Ising chip control program 222.

In a step S102, the CPU 210 executes the Ising chip control program 222 (hereinafter, each step is realized by the execution of the Ising chip control program 222) and sets a value spin of memory 701 of each spin unit 300. For the spin value, a random value is written for example. A predetermined value may also be written.

In a step S103, the CPU sets an initial value (as for the initial value, the number of operated bits 911 and an AND/OR selecting bit 912 are stored in the memory 910 to enhance bit probability) of bit probability in random bits output from the bit regulator 151 and reflects a set value in the bit regulator 151 in the Ising chip.

In a step S104, the CPU sets a number of times of continuation of interaction in setting the current bit probability.

In a step S105, the CPU instructs the Ising chip 100 to execute interaction, the Ising chip performs one interaction, and the Ising chip updates the value of the spin. Simultaneously, the CPU increments the number of times of interaction execution.

In a step S106, the CPU determines whether interaction is executed the number of times set in the step S104 for the number of times of the interaction execution. If interaction is not executed the set number of times, a process is returned to the step S105 and when interaction is executed by the set number of times, the process proceeds to a step S107.

In the step S107, the CPU determines whether the currently set bit probability is below a termination threshold (a bit probability final lower-limit value when interaction is sequentially executed by the set number of times, lowering bit probability and it is conceivable that the spin array reaches the global optimum solution within an allowable error). When the currently set bit probability is below the termination threshold, the process proceeds to a step S110 and if not, the process proceeds to a step S108.

In the step S108, the CPU updates the bit probability to a lower-value than the current value, selects set values of the number of operated bits 911 and the AND/OR selecting bit 912 for generating random bits having the updated bit probability, and reflects the new set values in the bit regulator 151 in the Ising chip.

In a step S109, the CPU sets a number of times of continuation of interaction at the updated bit probability. Further, the CPU resets the number of times of execution of interaction to 0. The number of times of continuation set above may also be the same as the number of times of continuation determined in the step S104 and if necessary, the number of times of continuation may also be increased or decreased. When the step S109 is finished, the process is returned to the step S105.

In the step S110, the CPU reads a value of the spin array from the Ising chip 100 according to the Ising chip control program 222. The CPU converts the read value of the spin array to solution of the optimization problem to be solved according to the problem conversion program 221 and provides the solution to a user.

FIG. 12 shows one example of bit probability sequentially varied and set in searching for a ground state of the Ising model according to the flowchart shown in FIG. 11 and the number of times of continuation of its interaction. Immediately after a start of the search, the bit probability is first set to high one using OR operation. Hereby, as a value of spin is frequently inverted, local solution is readily avoided. As the search advances, the search is converged on one solution by gradually lowering the bit probability.

When the initial value of bit probability is set in the step S103 shown in FIG. 11, OR operation is selected as on the uppermost line in a table shown in FIG. 12 for example and the number of bits to be operated shall be 3 bits. At this setting, interaction is performed a hundred times. Afterward, when the bit probability and the number of times of interaction are updated and set in the step S108 and the step S109, the process proceeds to the next line in the table shown in FIG. 12. That is, OR operation is selected, the number of bits to be operated is set to 2 bits, and the number of times of interaction is set to 110 times. Similarly, every time the step S108 and the step S109 are executed, the update and the setting proceed to the next line in the table shown in FIG. 12 and when interaction at set values on the last line is finished, the search for a ground state is finished. As described above, a better solution can be readily acquired by increasing the number of times of interaction, lowering bit probability.

Second Embodiment

As described in the first embodiment, random bits are asynchronously propagated in each spin unit 300. Generally, since delay due to the buffer 821 is small, a situation that the same random bit is input to adjacent spin units 300 in the spin array 110 may occur. Especially, when the random number generation clock 160 of the random number generator 150 is slow, this trend becomes remarkable and the same random bit is input to multiple spin units 300. In such a situation, since behavior of an inverting logical circuit is uniform in adjacent spin units, there is possibility that capability to escape from local solution is deteriorated.

In a second embodiment, a configuration that reduces the abovementioned problems and can supply higher randomness to each spin unit will be described. In comparison with the first embodiment, since there is difference between the propagation path of random bits shown in FIG. 6 and the inside of the spin unit 300 shown in FIG. 9, the difference will be intensively described below. Since the second embodiment is common to the first embodiment except the difference, the description is omitted.

Figure 13:
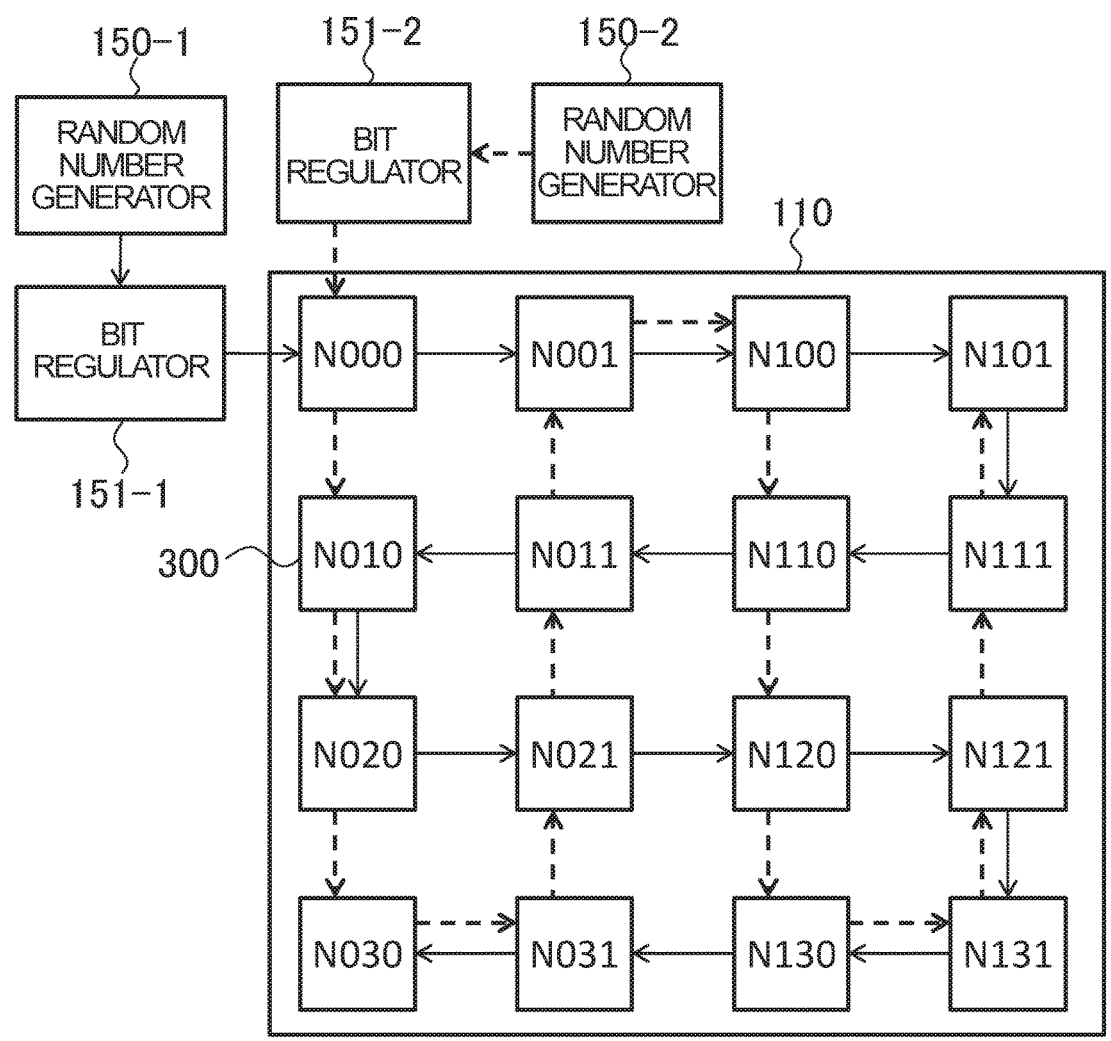
FIG. 13 illustrates a propagation path of random bits in a spin array in a second embodiment of the present invention.

FIG. 13 shows a propagation path of random bits in the second embodiment. An Ising chip in this embodiment is provided with two random number generators 150 and two bit regulators 151. A random bit output from the random number generator 150-1 and the bit regulator 151-1 is input to a spin unit N000 and is output rightward. In the whole chip, the random bits are propagated along a traversable path shown by arrows of a full line. In the meantime, a random bit output from the random number generator 150-2 and the bit regulator 151-2 is input to the spin unit N000 and is output downward. In the whole chip, the random bits are propagated along a traversable path shown by arrows of a broken line. That is, the configuration that two different random bits are input to each spin unit is adopted.

Figure 14:
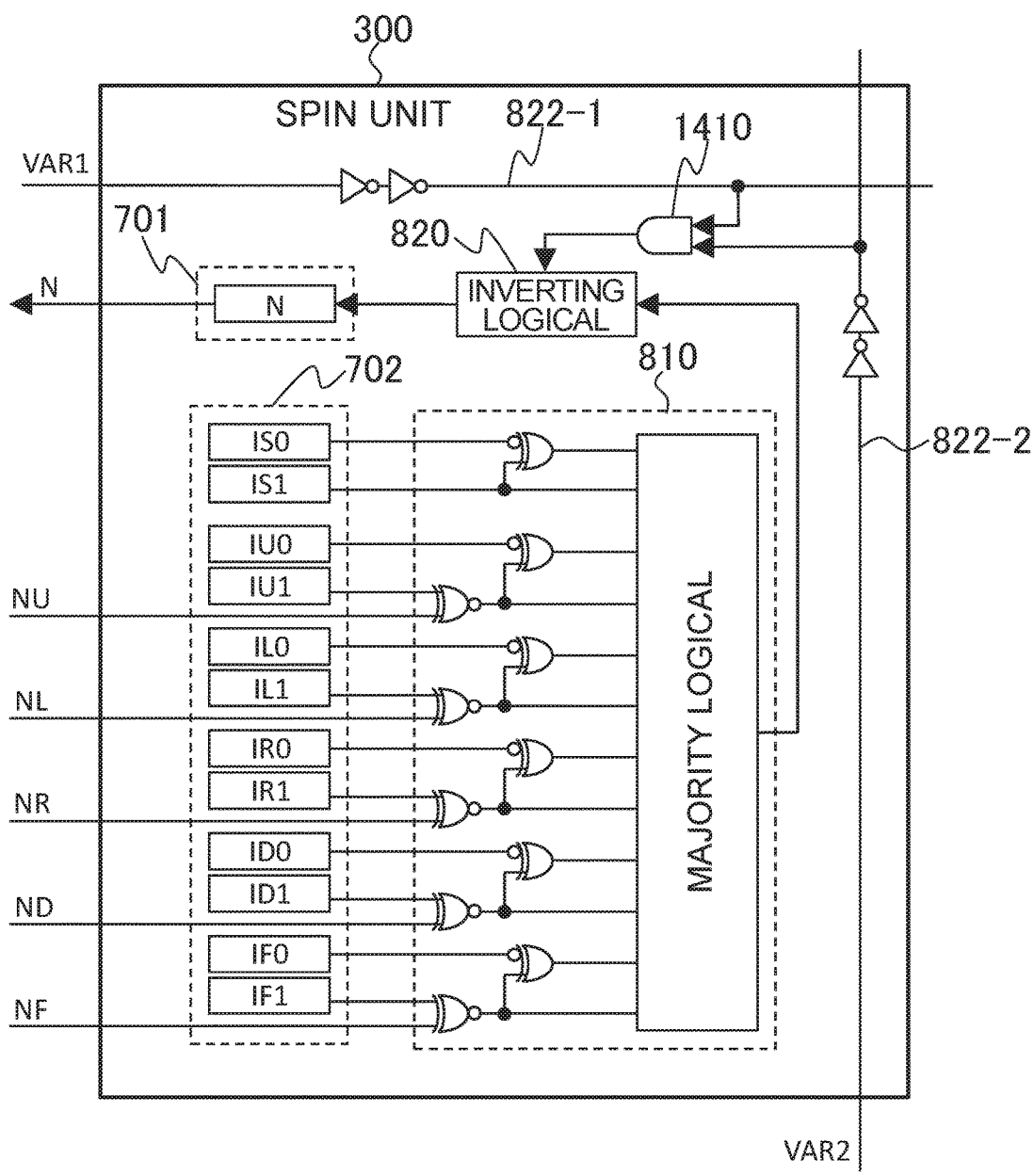
FIG. 14 illustrates a configuration of a spin unit in terms of operation for performing interaction in the second embodiment of the present invention.

FIG. 14 shows a configuration of the spin unit 300 in the second embodiment. The second embodiment is similar to the first embodiment in that a memory 701 that holds a spin, a memory 702 that holds an interaction coefficient and an external magnetic field coefficient, an interaction circuit 810, and an inverting logical circuit 820 are provided. In this embodiment, each spin unit 300 is provided with two random bit lines 822 that propagate each random bit from its adjacent cell. Each random bit propagated in the random bit line 822-1 and the random bit line 822-2 is input to an AND gate 1410 and output of the AND gate 1410 is input to the inverting logical circuit 820. That is, only when both random bits in the two systems input to the spin unit 300 are "1", a value of spin is inverted by the inverting logical circuit 820.

Even if the operation clock of the random number generator is not high speed enough, a phenomenon that the behavior of the inverting logical circuit is uniform in the adjacent spins can be reduced by combining two random bits different in the propagation path. In searching for a ground state of an Ising model, it can be expected that precision of finally acquired solution is enhanced by 5 to 40% by increasing the number of the random bit lines from one to two.

Third Embodiment

As described in the first embodiment, since random bits are asynchronously propagated in each spin unit, delay when they are propagated in one spin unit is small. However, when a spin array includes extremely multiple spin units, time until a random bit input from a bit regulator reaches a spin unit at a termination is also extended. In the meantime, in a process in which a ground state of an Ising model is searched, bit probability is required to be lowered as time elapses. At this time, at timing for switching bit probability, such unevenness of bit probability that bit probability of a spin unit close to a bit regulator is low and bit probability of a spin unit far from the bit regulator remains high occurs. Such the unevenness of bit probability may have a bad effect on precision of the search for a ground state.

In a third embodiment, a configuration that reduces the abovementioned problems and inhibits the unevenness of bit probability even if multiple spin units are included will be described. Since a propagation path of random bits in the third embodiment is different from the propagation path of random bits shown in FIG. 6 in the first embodiment, the difference will be mainly described below. As the other is common, the description is omitted.

Figure 15:
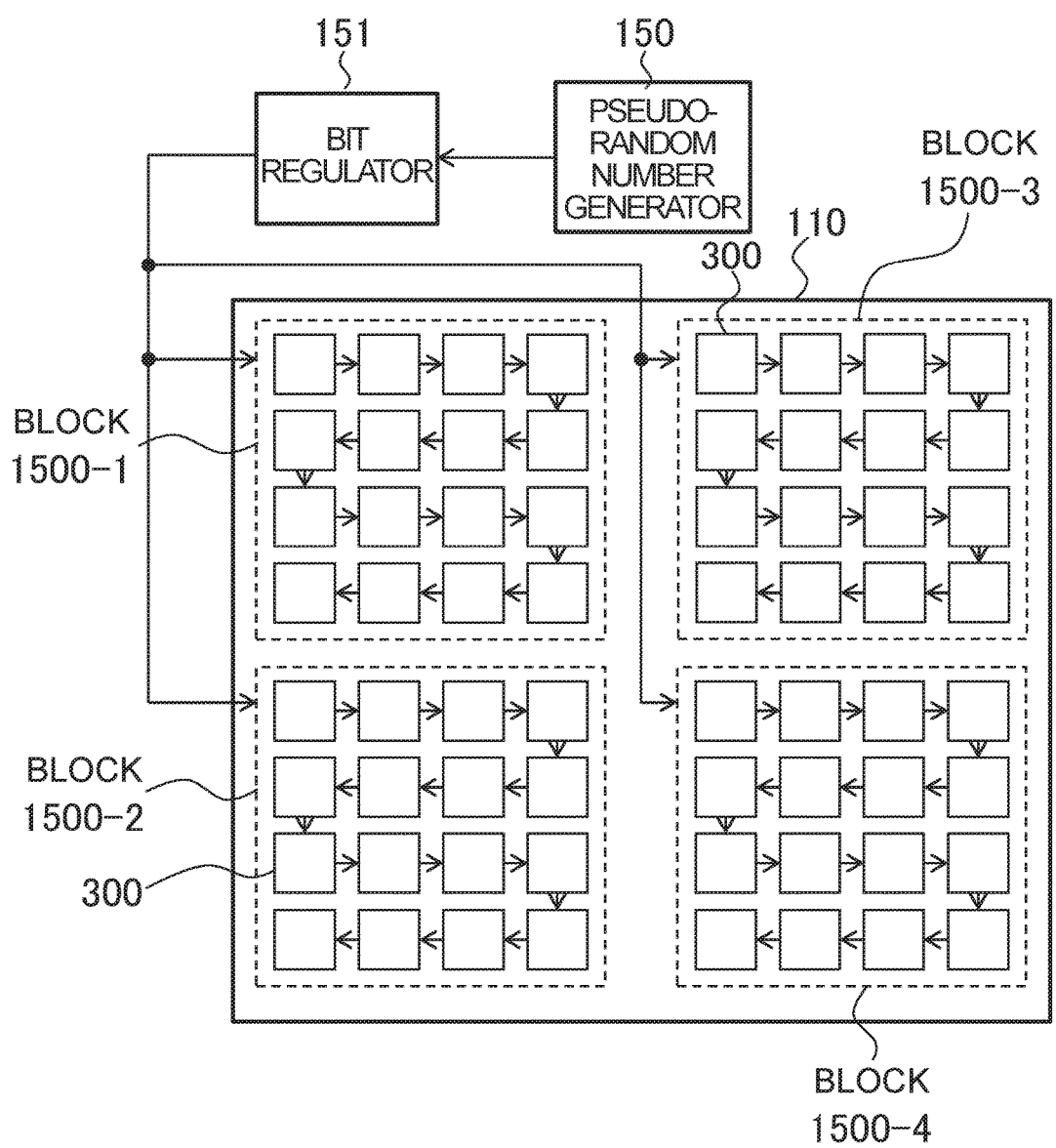
FIG. 15 illustrates a propagation path of random bits in a spin array in a third embodiment of the present invention.

FIG. 15 shows the propagation path of random bits in the third embodiment. A spin array 110 is divided into plural blocks 1500. The block 1500 includes plural spin units 300. A random bit output from the bit regulator 151 is input in a state in which the random bit is distributed to the spin unit at each head of the four blocks 1500-1 to 1500-4. Inside each block 1500, the random bits are propagated in a traversable path as shown in relation to the first embodiment.

Since one propagation path of random bits is substantially reduced by adopting such a configuration, the unevenness of bit probability inside the spin array can be reduced.

Fourth Embodiment

Figure 16:
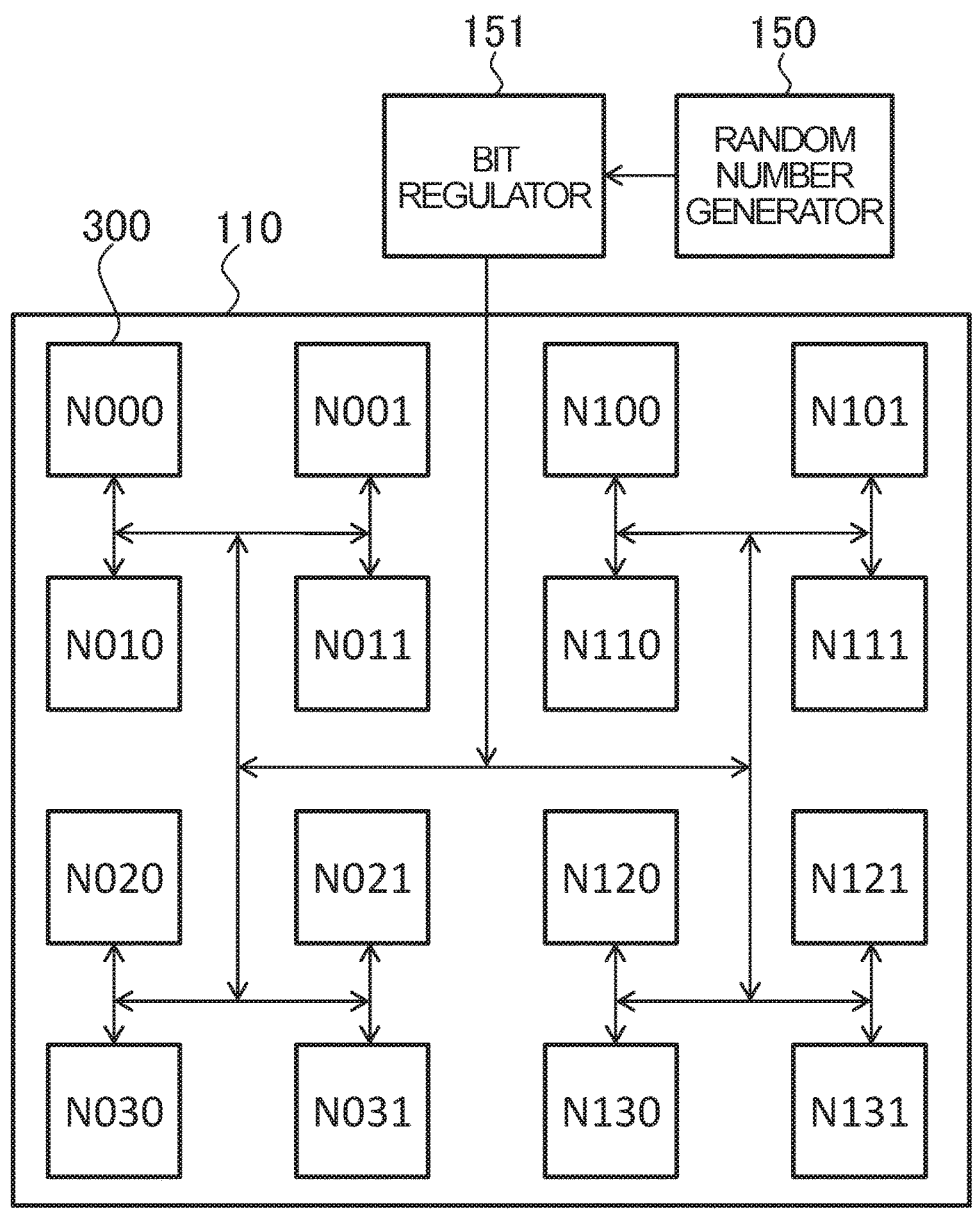
FIG. 16 illustrates a propagation path of random bits in a spin array in a fourth embodiment of the present invention.

FIG. 16 shows a propagation path of random bits in a fourth embodiment. Since the other part is common to that in the first embodiment, the description is omitted. A random bit output from a bit regulator 151 is propagated to each spin unit along a tree structure path shown by arrows in FIG. 16. Unevenness in access time of random bits in a spin array can be greatly reduced by adopting such a configuration.

LIST OF REFERENCE SIGNS

100 Ising chip
110 Spin array
120 I/O driver
130 I/O address decoder
140 Interaction address decoder
150 Random number generator
151 Bit regulator
152 Random bits output from random number generator 150
153 Random one bit
160 Random number generation clock
180 Interaction address
181 Interaction clock
190 Address bus
191 Data bus
192 I/O clock
193 R/W control line
200 Host computer
210 CPU
220 Memory
221 Problem conversion program
222 Ising chip control program
230 HDD
240 System bus
250 Information processing system
300 Spin unit
401 Word line
402 Bit line
701 Memory that holds value of spin
702 Memory that holds external magnetic field coefficient and interaction coefficient
810 Interaction circuit
820 Inverting logical circuit
821 Buffer
822 Random bit line
830 Spin value of adjacent spin unit
901 Bit selection unit
902 AND circuit
903 OR circuit
904 AND/OR selection unit
910 Memory
911 Number of operated bits
912 AND/OR selecting bit
1410 AND gate
1500 Block

The invention claimed is:
1. A semiconductor device, comprising:
a spin array where a plurality of spin units respectively provided with a memory cell that stores a value of each spin of an Ising model, a memory cell that stores an interaction coefficient from an adjacent spin which interacts with the corresponding spin, a memory cell that stores an external magnetic field coefficient of the corresponding spin, and circuits that determine the next state of the corresponding spin are arranged and connected on a two-dimensional plane on a semiconductor substrate in a state in which topology of the Ising model is maintained;

a random number generator that generates a plural-bit random number;

a bit regulator that operates output of the random number generator and supplies random one bit having variable bit probability; and one wire that supplies output of the bit regulator to all spin units in the spin array.

2. The semiconductor device according to claim 1, wherein the bit regulator includes:

a bit selection unit that extracts only the number m of bits specified by the number m of operated bits from an input n-bit random number according to the number m of the operated bits stored in a memory;

an AND circuit that ANDs each bit in an m-bit value which is output of the bit selection unit and outputs a 1-bit value;

an OR circuit that ORs each bit in the m-bit value which is the output of the bit selection unit and outputs a 1-bit value; and an AND/OR selection unit that selects the output of the AND circuit or the OR circuit according to an AND/OR selecting bit stored in the memory and outputs the selected output as output of the whole bit regulator.

3. The semiconductor device according to claim 1, wherein the wire passes all spin units in the spin array only once in a traversable path;

a random bit is supplied to each spin unit via the wire; and each spin unit inverts a value of spin using a value of the random bit.

4. The semiconductor device according to claim 1, wherein all spin units in the spin array are divided in units of a plurality of blocks;

the output of the bit regulator is distributed to wire branched for each of the blocks; and each of the blocks supplies a random bit to all spin units in each of the blocks via one independent wire.

5. The semiconductor device according to claim 1, wherein the output of the bit regulator is supplied into the spin array via one wire;

the wire is branched in tree structure in the spin array and each branch wire at an end is connected to respective spin units; and a random bit is supplied to the spin unit via wiring having the tree structure.

6. The semiconductor device according to claim 1, further comprising:

a second random number generator; and a second bit regulator, wherein the second bit regulator operates output of the second random number generator and supplies a second random bit to all spin units in the spin array via another second wire that is different from the wire; and each spin unit inverts a value of spin using a result of AND operation of the random bit and the second random bit.

7. The semiconductor device according to claim 1, comprising:

a random number generator located outside the semiconductor device, a terminal for inputting a random bit output from a bit regulator and one wire for supplying the input random bit to all spin units in the spin array in place of the random number generator and the bit regulator respectively provided in the semiconductor device, wherein each of the spin units inverts a value of spin using a value of the random bit.

8. An information processing system comprising:

a semiconductor device a CPU, a memory, and a HDD connected to a system bus, wherein a problem conversion program executed in the CPU generates an interaction coefficient and an external magnetic field coefficient of an Ising model that represents an object problem; and wherein the CPU of the semiconductor device is configured to generate an initial spin array at random;

writes the initial spin array, the interaction coefficient and the external magnetic field coefficient to the spin unit to which each spin of the Ising model is allocated in the spin array in the semiconductor device;

set an initial value of bit probability in random bits output from the bit regulator and a number of times of interaction corresponding to the bit probability;

repeatedly execute a ground state search process of each of all spin units in the spin array by the set number of times of interaction;

perform update for lowering bit probability and resetting of the number of times of interaction when the set bit probability does not reach a final lower limit threshold and repeatedly executes the ground state search process of the spin unit; and read a spin array of the spin unit that reaches a ground state so as to acquire solution of the object problem, and wherein the semiconductor device comprises a spin array where a plurality of spin units respectively provided with a memory cell that stores a value of each spin of an Ising model, a memory cell that stores an interaction coefficient from an adjacent spin which interacts with the corresponding spin, a memory cell that stores an external magnetic field coefficient of the corresponding spin, and circuits that determine the next state of the corresponding spin are arranged and connected on a two-dimensional plane on a semiconductor substrate in a state in which topology of the Ising model is maintained;

a random number generator that generates a plural-bit random number;

a bit regulator that operates output of the random number generator and supplies random one bit having variable bit probability; and one wire that supplies output of the bit regulator to all spin units in the spin array.

9. An information processing system comprising: CPU, a memory, an HDD and a semiconductor device applicable as an accelerator are connected to a system bus, wherein the semiconductor device comprises:

a spin array where a plurality of spin units respectively provided with a memory cell that stores a value of each spin of an Ising model, a memory cell that stores an interaction coefficient from an adjacent spin which interacts with the corresponding spin, a memory cell that stores an external magnetic field coefficient of the corresponding spin, and circuits that determine the next state of the corresponding spin are arranged and connected on a two-dimensional plane on a semiconductor substrate in a state in which topology of the Ising model is maintained;

a random number generator that generates a plural-bit random number;
a bit regulator that operates output of the random number generator and supplies a random one bit having variable bit probability;
one wire that supplies output of the bit regulator to all spin units in the spin array; and
an I/O interface that reads/writes data from/to the memory cell of the spin unit arranged in the spin array;
a problem conversion program executed in the CPU generates an interaction coefficient and an external magnetic field coefficient of the Ising model that represents an object problem; and
a control program executed in the CPU of the semiconductor device:
generates an initial spin array at random;
writes the initial spin array, the interaction coefficient and the external magnetic field coefficient to the spin unit to which each spin of the Ising model is allocated in the spin array in the semiconductor device;
sets an initial value of bit probability in random bits output from the bit regulator and a number of times of interaction corresponding to the bit probability;
repeatedly executes a ground state search process of each of all spin units in the spin array by the set number of times of interaction;
performs update for lowering bit probability and resetting of the number of times of interaction when the set bit probability does not reach a final lower limit threshold and repeatedly executes the ground state search process of the spin unit; and
reads a spin array of the spin unit that reaches a ground state so as to acquire solution of the object problem.

* * * * *